(12) United States Patent
Hosoda et al.

(10) Patent No.: US 7,419,869 B2
(45) Date of Patent: Sep. 2, 2008

(54) SEMICONDUCTOR DEVICE AND A METHOD FOR MANUFACTURING THE SAME

(75) Inventors: Naohiro Hosoda, Hitachinaka (JP); Tetsuo Adachi, Hitachinaka (JP)

(73) Assignee: Renesas Technology Corp., Tokyo (JP)

( * ) Notice: Subject to any disclaimer, the term of this patent is extended or adjusted under 35 U.S.C. 154(b) by 388 days.

(21) Appl. No.: 11/350,117

(22) Filed: Feb. 9, 2006

(65) Prior Publication Data

US 2006/0186468 A1 Aug. 24, 2006

(30) Foreign Application Priority Data

Feb. 9, 2005 (JP) .............................. 2005-032976

(51) Int. Cl.
*H01L 21/8234* (2006.01)
*H01L 21/336* (2006.01)

(52) U.S. Cl. ...................... 438/238; 438/257; 438/258; 438/266

(58) Field of Classification Search ................. 438/238, 438/257, 258, 241, 266, 587
See application file for complete search history.

(56) References Cited

U.S. PATENT DOCUMENTS

| | | | | |
|---|---|---|---|---|
| 7,064,380 B2 * | 6/2006 | Fukumura et al. | ........... | 257/315 |
| 7,282,411 B2 * | 10/2007 | Kanamitsu et al. | .......... | 438/257 |
| 2002/0192887 A1 * | 12/2002 | Adachi et al. | ................ | 438/197 |
| 2003/0122181 A1 * | 7/2003 | Wu | ............................. | 257/315 |
| 2006/0001081 A1 * | 1/2006 | Sasago et al. | ................ | 257/316 |

FOREIGN PATENT DOCUMENTS

| JP | 2001-028428 | 1/2001 |
|---|---|---|
| JP | 2004-152977 | 5/2004 |

* cited by examiner

*Primary Examiner*—Michael Trinh
(74) *Attorney, Agent, or Firm*—Antonelli, Terry, Stout & Kraus, LLP.

(57) ABSTRACT

Provided is a manufacturing method of a semiconductor device which has the following steps of forming a plurality of layered patterns obtained by stacking an insulating film, a conductor film for forming a floating gate electrode and another insulating film over a semiconductor substrate in the order of mention, forming sidewalls over the side surfaces of the plurality of layered patterns, removing a damage layer of the semiconductor substrate between any two adjacent layered patterns by dry etching, forming an insulating film over the semiconductor substrate between two adjacent layered patterns, and forming a plurality of assist gate electrodes over the insulating film between two adjacent layered patterns in self alignment therewith. According to the present invention, a semiconductor device having a flash memory has improved reliability.

13 Claims, 38 Drawing Sheets

SEMICONDUCTOR DEVICE AND A METHOD FOR MANUFACTURING THE SAME

CROSS-REFERENCE TO RELATED APPLICATION

The present application claims priority from Japanese patent application No. 2005-032976 filed on Feb. 9, 2005, the content of which is hereby incorporated by reference into this application.

BACKGROUND OF THE INVENTION

The present invention relates to a semiconductor device and a manufacturing technology thereof, particularly to a semiconductor device having a nonvolatile memory such as EEPROM (Electrically Erasable Programmable Read Only Memory) or a flash memory and a technology effective when applied to its manufacturing method.

For example, a semiconductor integrated circuit device having a third gate, which has a function different from that of a floating gate and a control gate, buried in a space between floating gates existing in a direction vertical or parallel to a word line (control gate) and channel, and a manufacturing method of the device are described in Japanese Unexamined Patent Publication No. 2001-28428.

In Japanese Unexamined Patent Publication No. 2004-152977, described is a semiconductor memory device having an assist gate electrode at a position which is between source and drain regions formed in parallel to each other and is parallel to these regions but does not overlap therewith, using the assist electrode as an assist electrode for source-side hot electron injection during writing and an inversion layer formed below the assist electrode as the source or drain region during reading.

SUMMARY OF THE INVENTION

AND flash memories having assist gate (AG) electrodes (which will hereinafter be called "AG-AND flash memories") which carry out writing operations by source-side hot electron injection have been developed. By using assist gate electrodes as writing gates to drastically decrease a channel current, writing in memory cells of a kilo-bit class can be carried out simultaneously in a short period of time. In addition, the area of memory cells can be reduced by employing a self alignment process for the formation of floating gate electrodes and employing assist gate electrodes for field isolation.

AG-AND flash memories having floating gate electrodes manufactured in a self alignment process can be formed, for example, in the following manner. First, assist gate electrodes are formed over the main surface of a semiconductor substrate and sidewalls made of an insulating film are formed on the side surfaces of each of the assist gate electrodes. After formation of a tunnel insulating film (FTO (Fowler-Nordheim Tunnel Oxide) film) over the surface of the semiconductor substrate exposed between two adjacent assist gate electrodes, each floating gate electrode is formed between two adjacent assist gate electrodes. The sidewalls are formed by depositing an insulating film covering therewith the assist gate electrodes, and then subjecting the film to anisotropic dry etching using, for example, RIE (Reaction Ion Etching) to leave the insulating film only on the side surfaces of the assist gate electrodes. Control gate electrodes are then formed over the floating gate electrodes via an interlayer film.

AG-AND flash memories having floating gate electrodes formed by a self alignment process have, however, various technical problems which will be described below.

It has been elucidated that when sidewalls are formed over the side surfaces of each of the assist gate electrodes, anisotropic dry etching gives a damage to the surface of the semiconductor substrate and this damage causes a reduction in breakdown voltage of the tunnel insulating film which will be formed by the later step. The present inventors investigated removal of a damage layer by etching, after the anisotropic dry etching, the surface of the semiconductor substrate by about 10 nm by post-treatment (dry etching) and then forming a pre-oxide film over the surface of the semiconductor substrate by thermal oxidation. Addition of the post-treatment and thermal oxidation steps however complicates the manufacturing process. Moreover, an etched amount of the semiconductor substrate during the post-treatment varies largely, which causes a reduction in the breakdown voltage of the tunnel insulating film owing to partial thinning of the tunnel insulating film. This leads to deterioration in repeated rewriting characteristics of the memory cell.

An object of the present invention is to provide a technology capable of improving the reliability of a semiconductor device having a flash memory.

The above-described and the other objects and novel features of the present invention will be apparent from the description herein and accompanying drawings.

Of the inventions disclosed by the present application, the representative ones will next be summarized briefly.

In the present invention, there is thus provided a semiconductor device having, over a semiconductor substrate, a plurality of nonvolatile memory cells each comprising a plurality of assist gate electrodes, a plurality of control gate electrodes placed to intersect with the plurality of assist gate electrodes, and a plurality of floating gate electrodes for charge accumulation disposed at a position which is between any two adjacent ones of the plurality of assist gate electrodes and two-dimensionally overlaps with the plurality of control gate electrodes, wherein the lower surface of the plurality of floating gate electrodes lies at a higher position than the lower surface of the plurality of assist gate electrodes.

In the present invention, there is also provided a manufacturing method of a semiconductor device, which comprises the steps of forming a plurality of layered patterns obtained by stacking over a semiconductor substrate, a tunnel insulating film, and a conductor film and an insulating film for the formation of floating gate electrodes in the order of mention, forming sidewalls over the side surfaces of each of the plurality of layered patterns, removing a damage layer of the semiconductor substrate between any two adjacent ones of the plurality of layered patterns by dry etching, forming an assist gate insulating film over the semiconductor substrate between any two adjacent ones of the plurality of layered patterns, and forming a plurality of assist gate electrodes over the assist gate insulating film between any two adjacent ones of the plurality of layered patterns in self alignment with the plurality of layered patterns.

An advantage of the representative inventions, of the inventions disclosed by the present application, will next be described briefly.

The present invention makes it possible to form a tunnel insulating film of a memory cell over the main surface of a semiconductor substrate which is clean and damage-free so that the memory cell thus obtained has high reliability, resulting in improvement of the reliability of the semiconductor device having a flash memory.

DETAILED DESCRIPTION OF THE INVENTION

Figure 1:
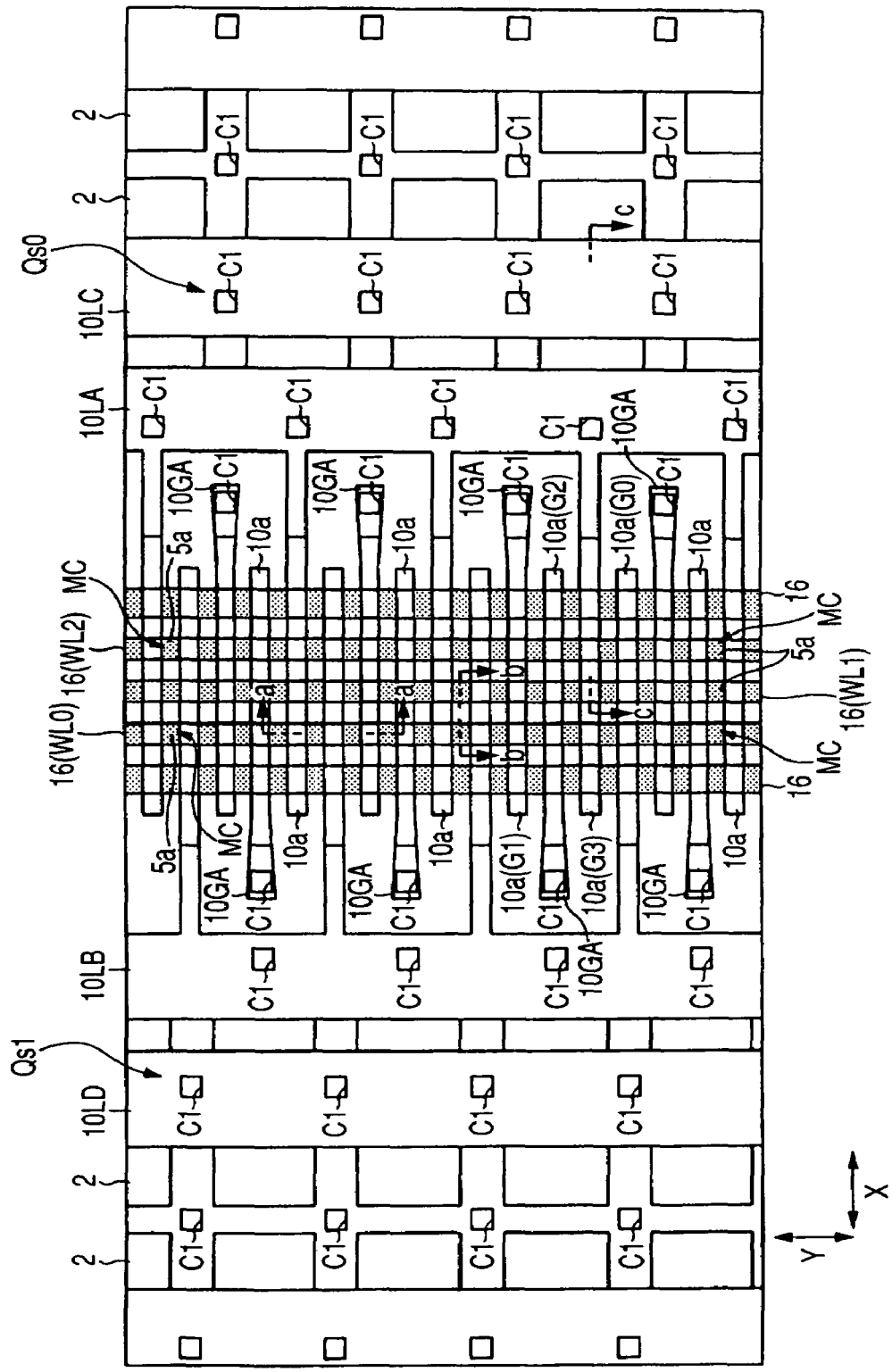
FIG. 1 is a fragmentary plan view of an AG-AND flash memory according to Embodiment 1 of the present invention.

In the below-described embodiment, a description will be made after divided in plural sections or in plural embodiments if necessary for convenience's sake. These plural sections or embodiments are not independent each other, but in a relation such that one is a modification example, details or complementary description of a part or whole of the other one unless otherwise specifically indicated.

In the below-described embodiments, when a reference is made to the number of elements (including the number, value, amount and range), the number is not limited to a specific number but can be greater than or less than the specific number unless otherwise specifically indicated or principally apparent that the number is limited to the specific number.

Moreover in the below-described embodiments, it is needless to say that the constituting elements (including element steps) are not always essential unless otherwise specifically indicated or principally apparent that they are essential. Similarly, in the below-described embodiments, when a reference is made to the shape or positional relationship of the constituting elements, that substantially analogous or similar to it is also embraced unless otherwise specifically indicated or principally apparent that it is not. This also applies to the above-described value and range.

In the drawings used in the embodiments, even a plain view sometimes includes a shaded area to facilitate understanding of the drawings. In the embodiments, MIS.FET (Metal Insulator Semiconductor Field Effect Transistor) which is a typical example of field effect transistors is abbreviated as MIS, a p channel type MIS.FET is abbreviated as pMIS and an n channel type MIS.FET is abbreviated as nMIS.

In all the drawings for describing the embodiments, like members of a function will be identified by like reference numerals and overlapping descriptions will be omitted. The present invention will hereinafter be described in detail based on accompanying drawings.

Embodiment 1

Figure 2:
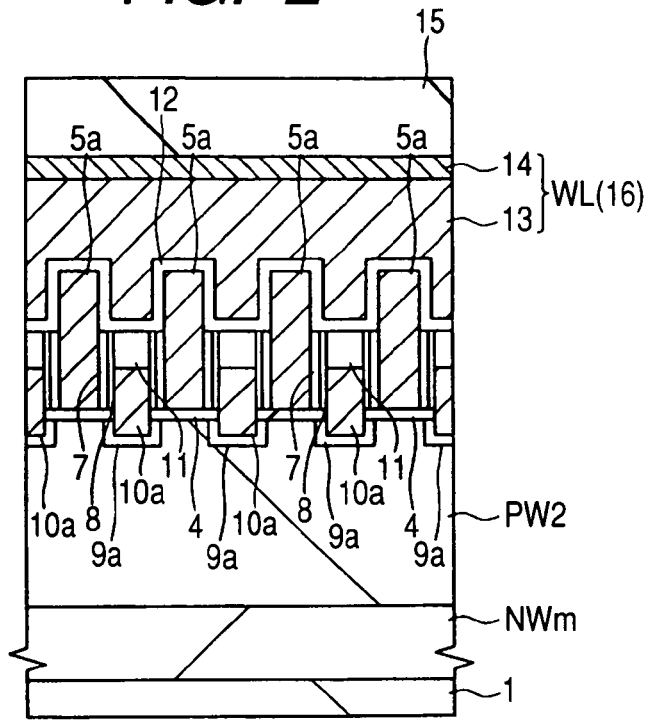
FIG. 2 is a cross-sectional view taken along a line a-a of FIG. 1.
Figure 3:
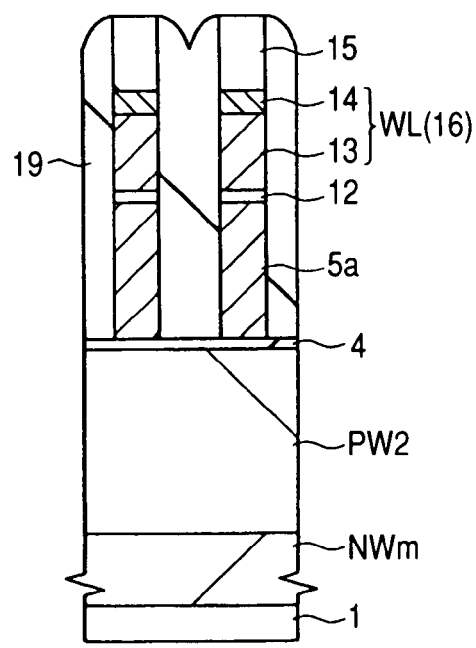
FIG. 3 is a cross-sectional view taken along a line b-b of FIG. 1.

In Embodiment 1, a description is made of one application example of the invention to, for example, a monofunctional 4-Mbit AG-AND flash memory. FIG. 1 is a fragmentary plan view of a memory array (memory cell, assist gate binding portion and selecting nMIS formation region) of an AG-AND flash memory according to Embodiment 1, FIG. 2 is a cross-sectional view taken along a line a-a of FIG. 1 and FIG. 3 is a cross-sectional view taken along a line b-b of FIG. 1.

A semiconductor substrate 1 of a semiconductor chip having a flash memory of this Embodiment 1 formed thereover is made of, for example, p type single crystal silicon. Over the main surface (device formation surface) thereof, isolation portions 2, a plurality of assist gate electrodes (first electrodes) 10a, a plurality of word lines WL (control gate electrodes 16 (second electrodes)), a plurality of floating gate electrodes (third electrodes) 5a, a plurality of nonvolatile memory cells (which will hereinafter be called "memory cells" simply) MC and a plurality of selecting nMIS Qs0 and Qs1 are placed. In the formation regions of the memory cell and selecting nMIS of the semiconductor substrate 1, p well PW2 and buried n well NWm are formed, while the p well PW2 is, at the periphery thereof (side surfaces and bottom surface), encompassed by a buried n well NWm.

The isolation portions 2 each defines the planar profile of an active region in which the device is formed and it is regarded, for example, as a shallow trench isolation region called STI (Shallow Trench Isolation) or SGI (Shallow Groove Isolation). It is formed by filling an insulating film such as silicon oxide in a shallow trench made in the semiconductor substrate 1.

The plurality of assist gate electrodes 10a each has a rectangular planar shape extending in a first direction X. The assist gate electrodes 10a are arranged in substantially parallel to each other in a second direction Y while maintaining a desired distance between any two of them. The size (width) of the assist gate electrode 10a in the second direction Y is, for example, about 75 nm and the distance between the two adjacent assist gate electrodes 10a is, for example, about 105 nm. The assist gate electrodes 10a are placed so that most of them overlap with the active region two-dimensionally. By the application of a desired voltage to the assist gate electrodes 10a, an n type inversion layer is formed in the main surface portion of the semiconductor substrate 1 in the active region along the assist gate electrodes 10a. This n type inversion layer is a portion forming a bit line (source and drain of memory cell MC). Accordingly, the active region has no semiconductor region constituting a bit line which is otherwise formed by the introduction of an impurity into the semiconductor substrate 1. The assist gate electrodes 10 not only function to form the bit line but also have an isolation function between two adjacent memory cells MC.

In a unit region of the memory cell, four assist gate electrodes 10a (G0 to G3) are for example located. In other words, four assist gate electrodes 10a (G0 to G3) constitute one set. In FIG. 1, a wide-width region 10GA for connection to upper interconnects is formed on the right end of an assist gate electrode 10a (G1) of the unit region; a wide-width region 10GA for connection to upper interconnects is formed on the left end of an assist gate electrode 10a (G2) which lies below and adjacent to the assist gate electrode 10a (G1); the right end of an assist gate electrode 10a (G3) which lies below and adjacent to the assist gate electrode 10a (G2) is connected to an interconnect 10LA; and the left end of an assist gate electrode 10a (G0) which lies below and adjacent to the assist gate electrode 10a (G3) is connected to an interconnect 10LB. The interconnects 10LA and 10LB have a belt-like pattern extending in the second direction Y of FIG. 1 and assist gate electrodes 10a (G3, G0) are connected integrally to them, respectively. In other words, the interconnects 10LA and 10LB are interconnects common to a plurality of assist gate electrodes 10a for supplying the same potential. Such assist gate electrodes 10a, wide-width region 10GA and interconnects 10LA and 10LB are formed by patterning a conductor film made of, for example, low resistance polycrystalline silicon in the same step.

The assist gate electrodes 10a are formed over the main surface of the semiconductor substrate 1 via an insulating film (third insulating film) 9a of about 8 nm to 10 nm in thickness made of, for example, silicon oxide after dry etching to remove a damage layer by about 10 nm to 20 nm. Over the side surfaces of each of all the assist gate electrodes 10a, an insulating film 7 made of, for example, silicon oxide and sidewalls 8 are formed. On the upper surface of the assist gate electrodes 10a, an insulating film (fourth insulating film) 11 made of, for example, silicon nitride is formed. In a portion of the width-wide region 10GA and interconnects 10LA and 10LB, contact holes C1 are placed. Via plugs in the contact holes C1, the assist gate electrodes 10 are electrically connected to a first-level interconnect thereover.

The number of the plurality of word lines WL formed per memory cell (memory mat) of one block is 256. In this Embodiment 1, the word lines WL0 to WL2 are illustrated in order to facilitate understanding of them. Each word line WL has a rectangular planar shape extending in the second direction Y. Described specifically, word lines WL are arranged substantially parallel to each other along the first direction X of FIG. 1 at desired intervals while crossing the assist gate electrodes 10a at right angles. A portion of the word line WL existing between two adjacent assist gate electrodes 10a is a control gate electrode 16 of the memory cell MC. The distance between two adjacent word lines WL is, for example, about 90 nm. The word lines WL are each composed of a film stack obtained by stacking a conductor film 13 made of low resistance polycrystalline silicon over a conductor film 14 made of a refractory metal silicide. Over the upper surface of these word lines WL, a cap insulating film 15 made of, for example, silicon oxide is deposited. As illustrated in FIG. 2, in the direction Y of each memory cell MC, the conductor film 13 constituting the lower layer of the word line WL is formed so as to fill between any two floating gate electrodes 5a via an interlayer film (fifth insulating film) 12.

The plurality of floating gate electrodes 5a are arranged in an electrically insulated state at intersections of a space between any two adjacent assist gate electrodes 10a with the word line WL. The floating gate electrodes 5a are each a charge accumulation layer for the data of the memory cell MC and is formed of, for example, low resistance polycrystalline silicon. The floating gate electrodes 5a are protruded relative to the surface of the semiconductor substrate 1 and have a projecting cross-section (rectangular shape in this drawing) in the direction crossing the main surface of the semiconductor substrate 1. In other words, the floating gate electrodes 5a have a columnar shape (quadrangular prism shape in this drawing) formed in regions sandwiched between the assist gate electrodes 10a and their height (height from the main surface of the semiconductor substrate 1) is adjusted to be higher than the height (height from the main surface of the semiconductor substrate 1) of the assist gate electrodes 10a. The size of the floating gate electrodes 5a in the first direction X is, for example, about 90 nm, while that in the second direction Y is, for example, about 65 nm.

The floating gate electrodes 5a are placed over the main surface of the semiconductor substrate 1 via an insulating film (first insulating film) 4. This insulating film 4 functions as a tunnel insulating film of the memory cell MC and as will described later, it is made of silicon oxide formed, for example, by thermal oxidation such as ISSG (In-Situ Steam Generation) oxidation over the main surface of the semiconductor substrate 1 which is clean and damage-free. The insulating film 4 has a thickness of, for example, from about 8 nm to 10 nm. As described above, it is formed over the main surface of the semiconductor substrate 1 via the insulating film 9a after a damage layer removing step of, for example, about 10 nm to 20 nm by dry etching. The floating gate electrodes 5a are formed over the main surface of the semiconductor substrate 1 via the insulating film 4 without such removal of the damage layer so that as illustrated in FIG. 2, the lower surface of the floating gate electrodes 5a brought into contact with the insulating film 4 is formed at a position higher than that of the lower surface of the assist gate electrodes 10a brought into contact with the insulating film 9a.

Between the floating gate electrodes 5a and the assist gate electrodes 10a are formed the insulating film 7 and sidewalls 8, by which the floating gate electrodes 5a are insulated from the assist gate electrodes 10a. Between two adjacent floating gates 5a and two adjacent word lines WL in the first direction X, an insulating film (sidewall 19) made of, for example, silicon oxide is formed and it insulates between the floating gate electrodes 5a and between word lines WL which are adjacent to each other in the first direction X.

An interlayer film 12 is formed between the floating gate electrode 5a and the control gate electrode 16 of the word line WL. The interlayer film 12 is a film for constituting a capacitor between the floating gate electrode 5a and the control gate electrode 16 and it is made of a so-called ONO film obtained by stacking a silicon oxide film, a silicon nitride film and a silicon oxide film one after another in the order of mention. The interlayer film 12 has a thickness of, for example, about 16 nm in terms of silicon dioxide ($SiO_2$) which is determined in consideration of a dielectric constant.

The plurality of selecting nMIS Qs0 and Qs1 are placed on a bit line side which will be a drain of the memory cell MC and on a bit line side which will be its source, respectively. On the bit line side of FIG. 1 which will be a drain, the selecting nMIS Qs0 are arranged along the second direction Y on the right side of FIG. 1 for each bit line. On the bit line side which will be a source, the selecting nMIS Qs1 are arranged along the second direction Y on the left side of FIG. 1 for each bit line. A description will next be made of the nMIS Qs0 on the bit line side which will be a drain. The nMIS Qs1 on the bit line side which will be a source has a structure similar to that of the nMIS Qs0 so that a description will be omitted.

As illustrated in FIG. 1, a gate electrode of the selecting nMIS Qs0 on the bit line side which will be a drain is formed in a portion (a portion of the active region crossing the belt-like region) of a belt-like interconnect 10LC extending in the second direction Y along the interconnect 10LA. A gate electrode of the selecting nMIS Qs1 on the bit line side which will be a source is formed in a portion (a portion of the active region crossing a belt-like region) of a belt-like interconnect 10LD extending in the second direction Y along the interconnect 10LB. The gate electrodes, and interconnects 10LC and 10LD of the selecting nMIS Qs0 and 1 are each made of, for example, low resistance polycrystalline silicon and are patterned simultaneously with the patterning of the assist gate electrodes 10a and wide-width region 10GA and interconnects 10LA and 10LB. In portions of the interconnects 10LC and 10LD, contact holes C1 are placed. Via plugs in the contact holes C1, the gate electrodes of the selecting nMIS Qs0 and Qs1 are electrically connected to the first-level interconnect thereover.

One example of a manufacturing method of the AG-AND flash memory according to this Embodiment 1 will next be described in the order of steps based on the fragmentary cross-sectional views of the semiconductor substrate illustrated in FIGS. 4 to 23. These drawings include memory cells (cross-sectional view taken along a line a-a of FIG. 1 and parallel to word lines and cross-sectional view taken along a line b-b of FIG. 1 and perpendicular to word lines), assist gate electrode binding portion (cross-sectional view taken along a line c-c of FIG. 1), selecting nMIS, peripheral circuit high breakdown voltage MIS, and peripheral circuit low breakdown voltage MIS.

Figure 4:
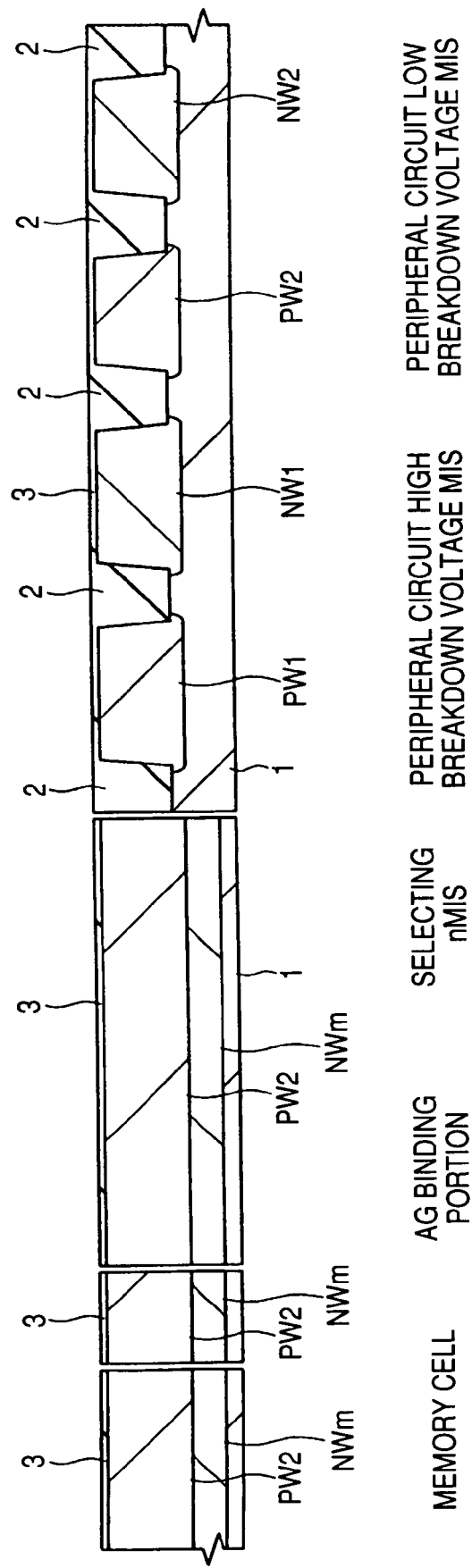
FIG. 4 is a fragmentary cross-sectional view of the AG-AND flash memory of Embodiment 1 of the present invention during its manufacturing step.

As illustrated in FIG. 4, shallow trench type isolation portions 2, for example, are formed in element isolation regions on the main surface of a semiconductor substrate (in this stage, a semiconductor thin plate having a substantially disc plane which is called "semiconductor wafer") 1 made of, for example, p type single crystal silicon. On an active region encompassed by the isolation portion 2 over the main surface of the semiconductor substrate 1, an insulating film 3 made of, for example, silicon oxide is then formed by thermal oxidation. This insulating film 3 has a function of protecting the semiconductor substrate 1 during ion implantation which will be described next.

Buried n-wells NWm are then formed by selectively introducing an n type impurity into the formation regions of the memory cell, assist gate electrode binding portion and selecting nMIS in accordance with the ion implantation method. In addition, a p well PW1 is formed in the formation region of the peripheral circuit high breakdown voltage nMIS, a p well PW2 is formed in the formation regions of the memory cell, assist gate electrode binding portion, selecting nMIS and peripheral circuit low breakdown voltage nMIS, an n well NW1 is formed in the formation region of the peripheral circuit high breakdown voltage pMIS, and NW2 is formed in the formation region of the peripheral circuit low breakdown voltage pMIS by selectively introducing a predetermined impurity at a predetermined energy in accordance with the ion implantation method.

Figure 5:
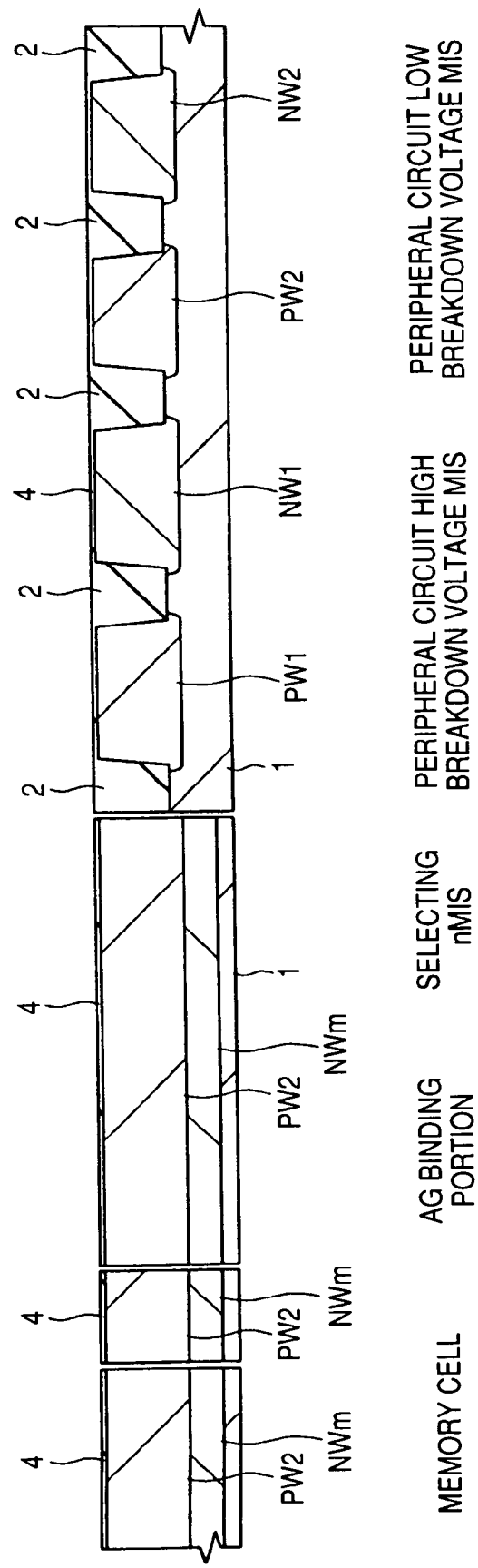
FIG. 5 is a fragmentary cross-sectional view of the same portion as that of FIG. 4 during a manufacturing step of the flash memory following that of FIG. 4.

As illustrated in FIG. 5, after removal of the insulating film 3, an insulating film 4 of, for example, about 8 nm to 10 nm in thickness serving as a tunnel insulating film (FTO film) of the memory cell is formed over the main surface of the semiconductor substrate 1, for example, by ISSG (In-Situ Steam Generation) oxidation. The ISSG oxidation is one of thermal oxidation methods which directly introduces hydrogen and oxygen in a thermal treatment chamber and effects a radical oxidation reaction over the heated semiconductor substrate 1. A silicon oxide film of about 8 nm in thickness can be formed over silicon, for example, by adjusting a hydrogen concentration to 10% or greater in an atmosphere of 900° C. ISSG oxidation is characterized in that compared with thermal oxidation by the conventional RPT (Rapid Thermal Process), it can suppress speed-up diffusion of oxygen into the semiconductor substrate 1.

Figure 6:
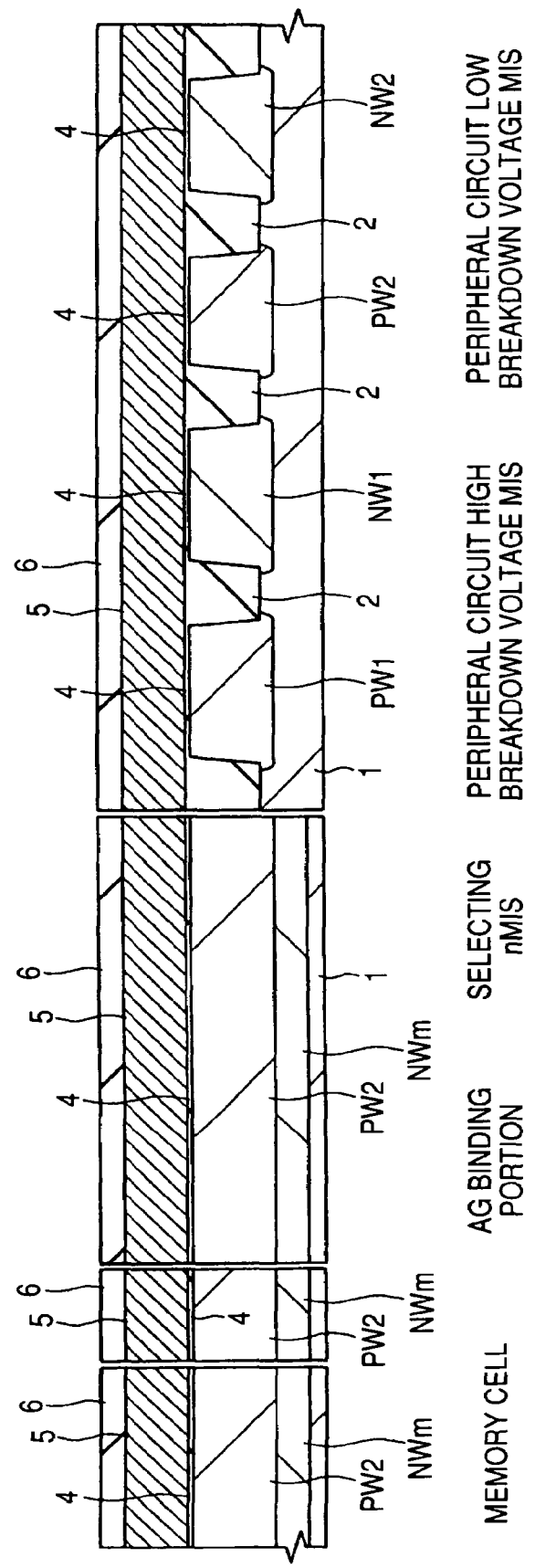
FIG. 6 is a fragmentary cross-sectional view of the same portion as that of FIG. 4 during a manufacturing step of the flash memory following that of FIG. 5.

As illustrated in FIG. 6, a conductor film 5, for example, of about 250 nm in thickness made of low resistance polycrystalline silicon is deposited over the main surface of the semiconductor substrate 1 by thermal CVD (Chemical Vapor Deposition), followed by deposition of an insulating film (second insulating film) made of silicon oxide and having a thickness of about 100 nm by CVD.

Figure 7:
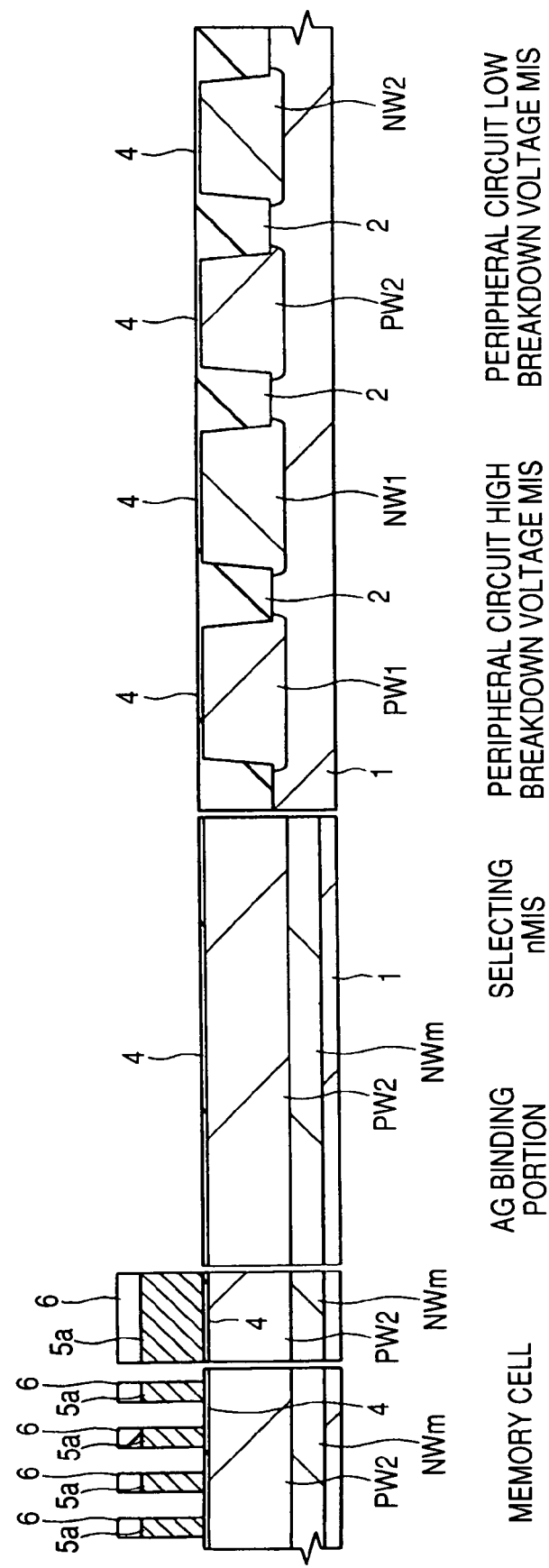
FIG. 7 is a fragmentary cross-sectional view of the same portion as that of FIG. 4 during a manufacturing step of the flash memory following that of FIG. 6.

As illustrated in FIG. 7, with a resist pattern formed by photolithography as a mask, the insulating film 6 and conductor film 5 exposed therefrom are removed by dry etching. By this, the floating gate electrodes 5a of the memory cell made of the conductor film 5 are patterned in the gate-width direction. The floating gate electrodes 5a each has a width of about 90 nm.

The floating gate electrodes 5a are disposed over the main surface of the semiconductor substrate 1 via the insulating film 4 serving as a tunnel insulating film of the memory cell. This insulating film 4 is formed over the main surface of the semiconductor substrate 1 which is clean and damage free, for example, by the ISSG oxidation and it has the conductor film 5 deposited thereover by thermal CVD which causes less damage so that high reliability can be imparted to the tunnel insulating film.

Figure 8:
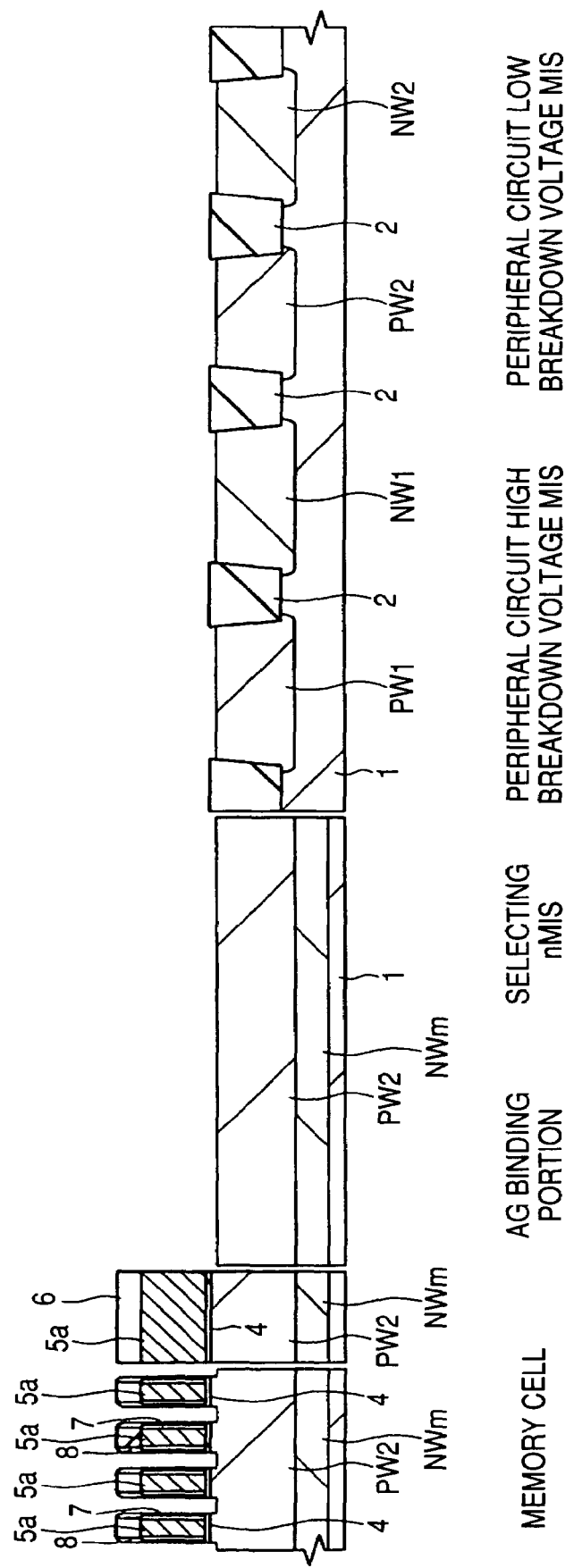
FIG. 8 is a fragmentary cross-sectional view of the same portion as that of FIG. 4 during a manufacturing step of the flash memory following that of FIG. 7.

As illustrated in FIG. 8, the semiconductor substrate 1 is subjected to thermal oxidation treatment to form an insulating film 7 made of silicon oxide over the side surfaces of each of the floating gate electrodes 5a. By this thermal oxidation treatment, the floating gate electrodes 5a have a width of about 80 nm. After deposition of an insulating film made of, for example, silicon oxide over the main surface of the semiconductor substrate by CVD, the resulting insulating film is etched back by anisotropic dry etching, whereby sidewalls 8 are formed over the side surfaces of each of the floating gate electrode 5a and insulating film 6. The total thickness of the insulating film 7 and sidewalls 8 is about 20 nm. During the formation of the sidewalls 8, a damage layer such as dislocation or crystal defects appears in single crystal silicon constituting the semiconductor substrate 1. The damage layer is therefore removed by etching a 10 nm to 20 nm portion from the surface of the semiconductor substrate 1, for example, by dry etching. Removal of the damage layer in such a manner enables removal of defects between the assist gate insulating film 9a which will be formed in the subsequent step and semiconductor substrate 1.

Figure 9:
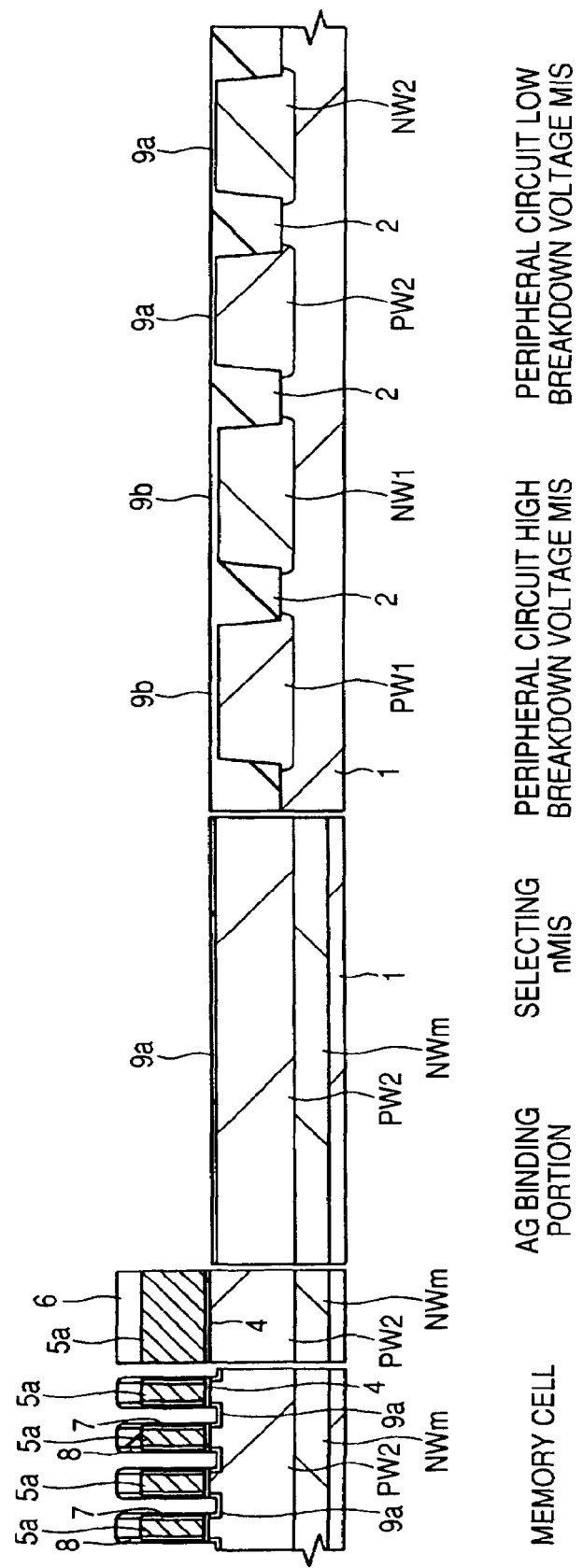
FIG. 9 is a fragmentary cross-sectional view of the same portion as that of FIG. 4 during a manufacturing step of the flash memory following that of FIG. 8.

As illustrated in FIG. 9, the insulating film 9a of about 9 nm in thickness and an insulating film 9b of about 25 nm in thickness are formed over the main surface of the semiconductor substrate 1, for example, by ISSG oxidation. The insulating film 9a constitutes, for example, an assist gate insulating film of the memory cell and gate insulating films of the selecting nMIS and peripheral circuit low breakdown voltage nMIS and pMIS, while the insulating film 9b constitutes gate insulating films of the peripheral circuit high breakdown voltage nMIS and pMIS.

These insulating films 9a and 9b are formed, for example, in the following manner. First, the semiconductor substrate 1 is subjected to thermal oxidation treatment using, for example, ISSG oxidation to form an insulating film (the sixth insulating film) made of silicon oxide and having, for example, a thickness of about 20 nm over the main surface of the semiconductor substrate. This thermal oxidation treatment may presumably form a bird's beak at the end portions of the insulating film 4 which has already been formed over the main surface of the semiconductor substrate 1. Use of ISSG oxidation method, however, suppresses the formation of the bird's beak. With a resist pattern formed by photolithography as a mask, the insulating film made of silicon oxide is removed by wet etching or dry etching from the formation regions of the memory array and peripheral circuit low breakdown voltage nMIS and pMIS. By the thermal oxidation treatment of the semiconductor substrate 1, an insulating film 9a made of silicon oxide is formed over the main surface of the semiconductor substrate 1 in the formation regions of the memory array and peripheral circuit low breakdown voltage nMIS and pMIS, while an insulating film 9b made of silicon oxide, for example, is formed over the main surface of the semiconductor substrate 1 in the formation regions of the peripheral circuit high breakdown voltage nMIS and pMIS. The insulating film 9a to be formed in the formation region of the memory cell functions as an assist gate insulating film.

Figure 10:
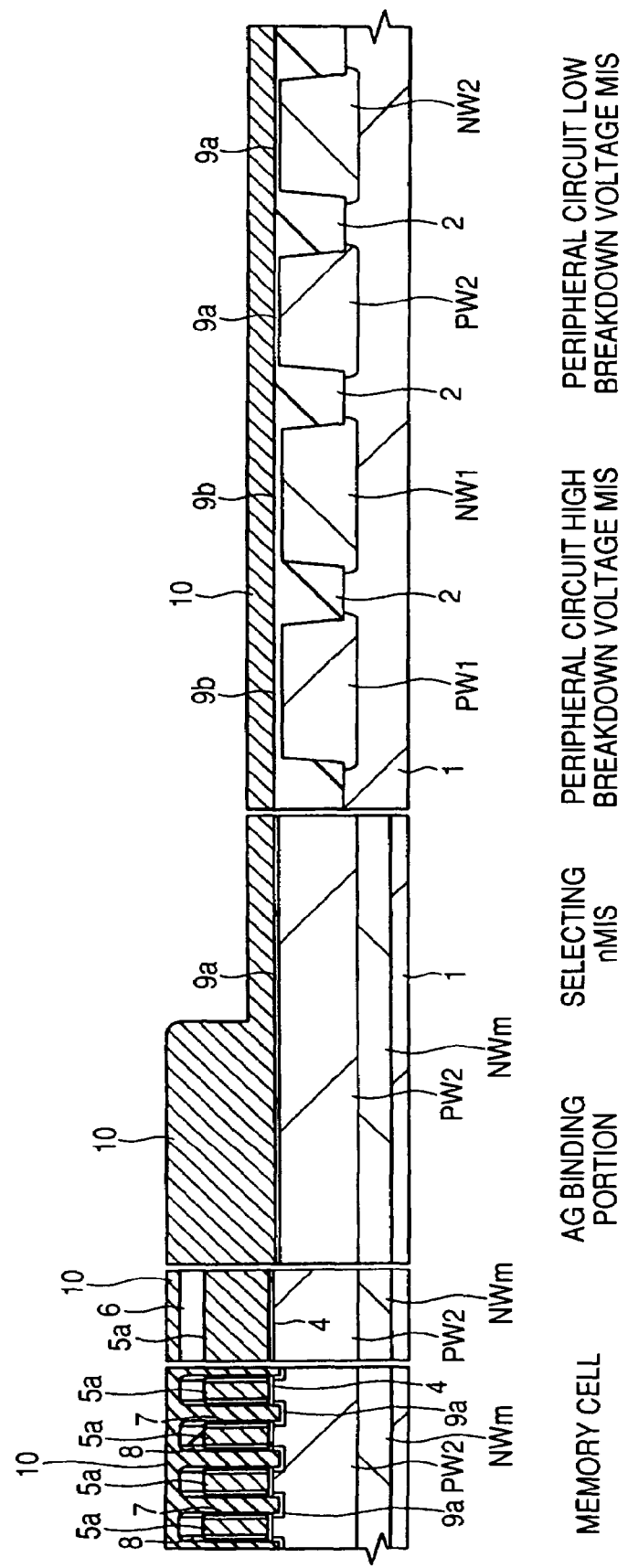
FIG. 10 is a fragmentary cross-sectional view of the same portion as that of FIG. 4 during a manufacturing step of the flash memory following that of FIG. 9.

As illustrated in FIG. 10, a conductor film 10 made of low resistance polycrystalline silicon and having a thickness of from about 90 nm to 100 nm is deposited over the main surface of the semiconductor substrate 1. Since the distance between the two adjacent floating gate electrodes 5a is, for example, about 90 nm so that the conductor film 10 is filled between the two adjacent floating gate electrodes 5a.

Figure 11:
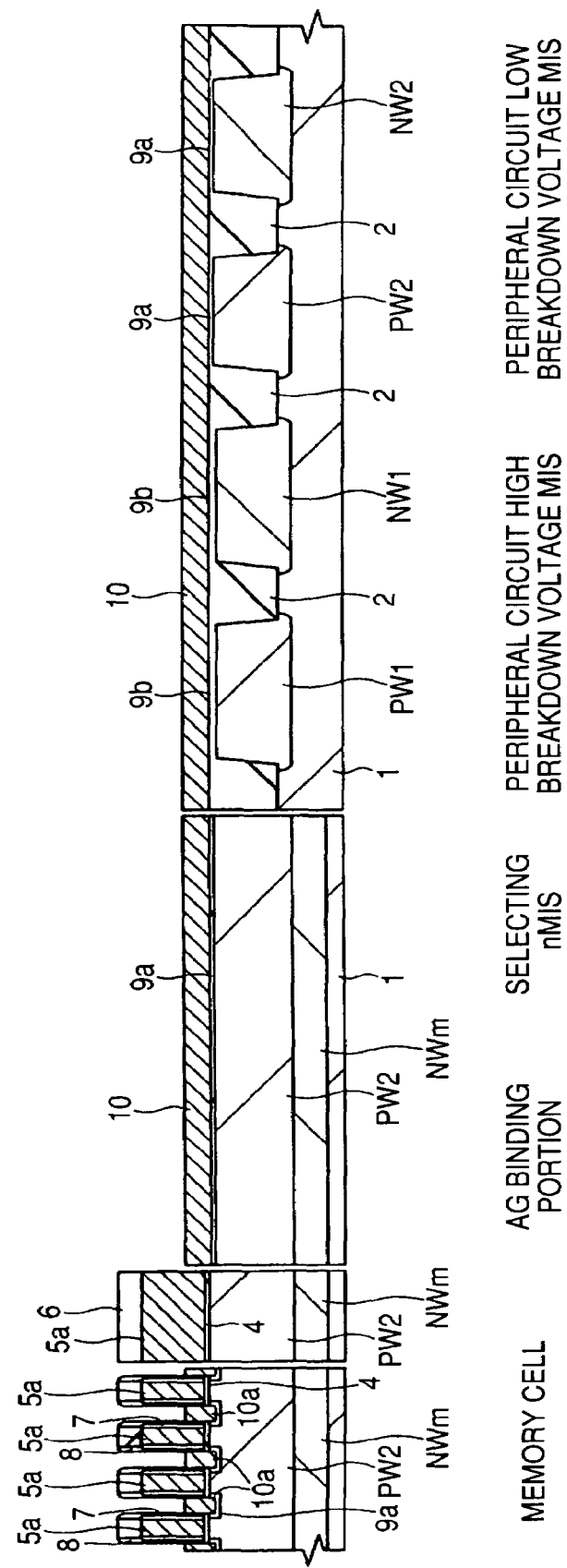
FIG. 11 is a fragmentary cross-sectional view of the same portion as that of FIG. 4 during a manufacturing step of the flash memory following that of FIG. 10.

As illustrated in FIG. 11, with a resist pattern formed by photolithography as a mask, an unnecessary portion of the conductor film 10 exposed therefrom is removed by wet etching, whereby the assist gate electrodes 10a of the memory cell made of the conductor film 10 are patterned in the gate-width direction.

Figure 12:
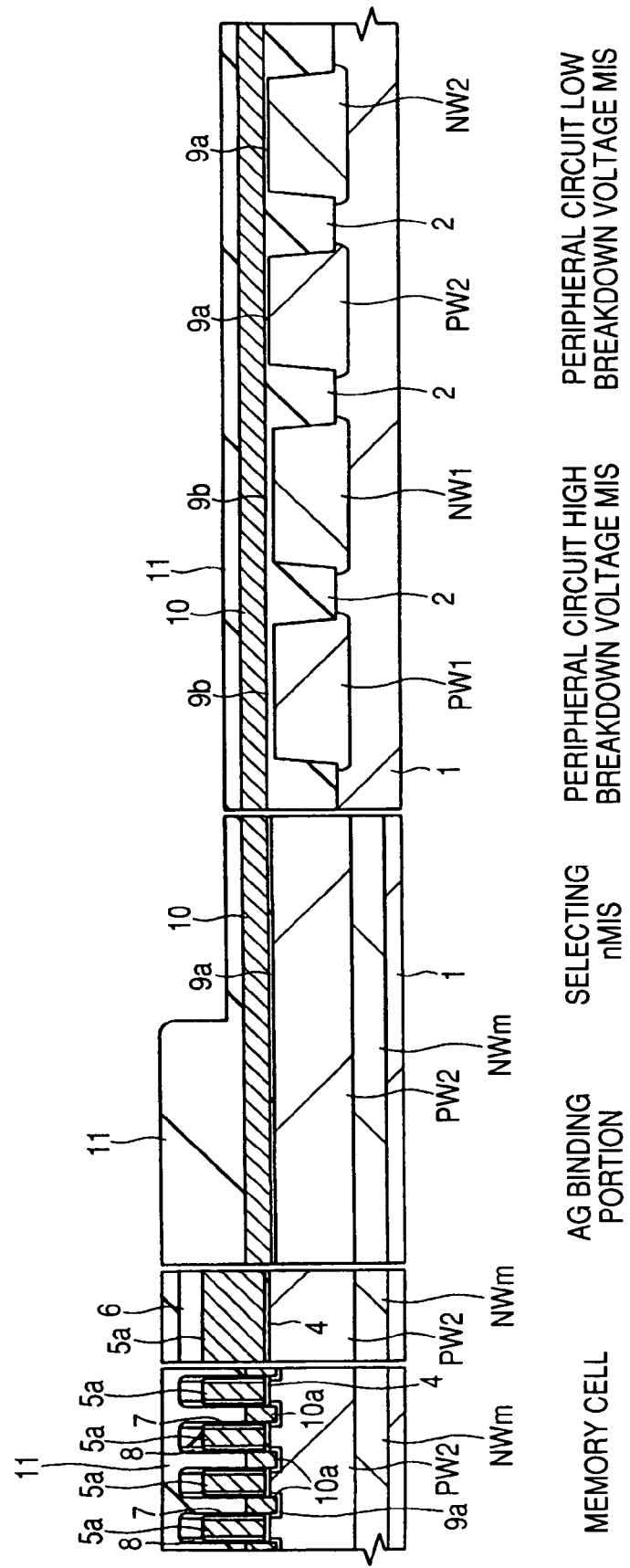
FIG. 12 is a fragmentary cross-sectional view of the same portion as that of FIG. 4 during a manufacturing step of the flash memory following that of FIG. 11.

As illustrated in FIG. 12, an insulating film 11 made of silicon nitride and having a thickness of from 90 nm to 100 nm is deposited over the main surface of the semiconductor substrate 1. The distance between the two adjacent floating gate electrodes 5a is, for example, about 90 nm so that the insulating film 11 is filled between the two adjacent floating gate electrodes 5a.

Figure 13:
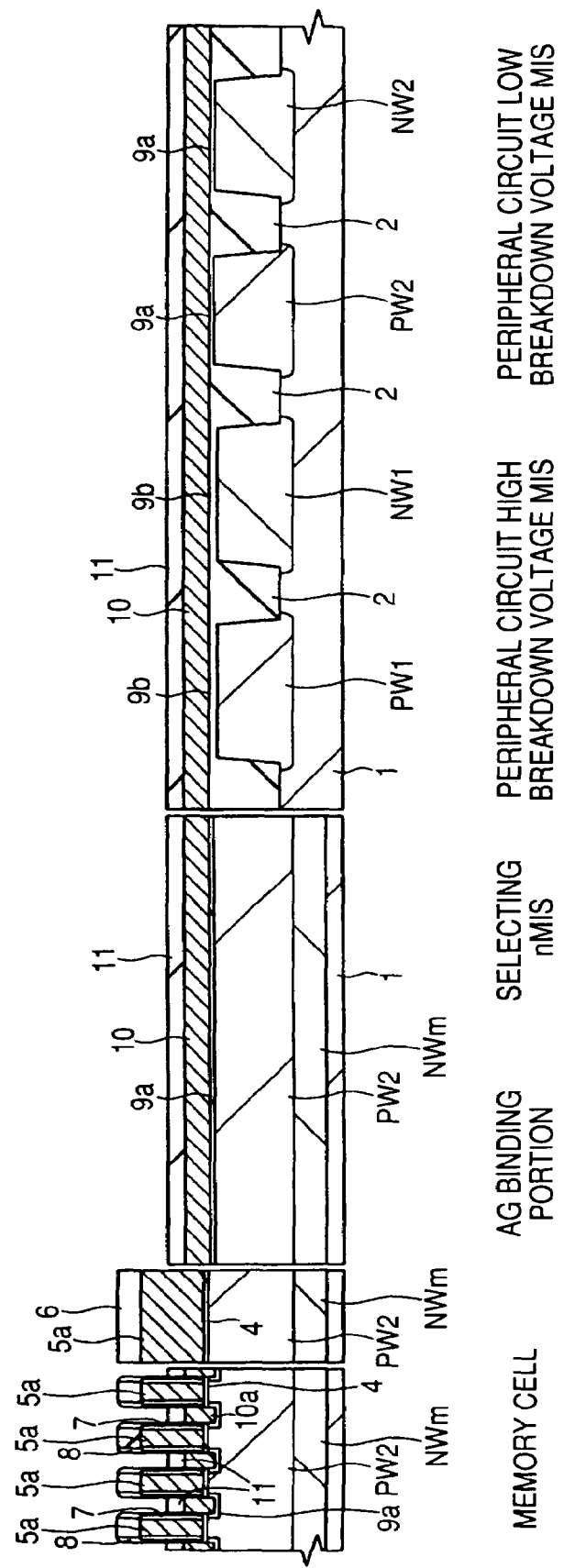
FIG. 13 is a fragmentary cross-sectional view of the same portion as that of FIG. 4 during a manufacturing step of the flash memory following that of FIG. 12.

As illustrated in FIG. 13, with a resist pattern formed by photolithography as a mask, an unnecessary portion of the insulating film 11 is removed by wet etching, whereby the insulating film 11 can be left over the assist gate electrodes 10a of the memory cell and the conductor film 10 in the formation regions of the selecting nMIS and peripheral circuit.

Figure 14:
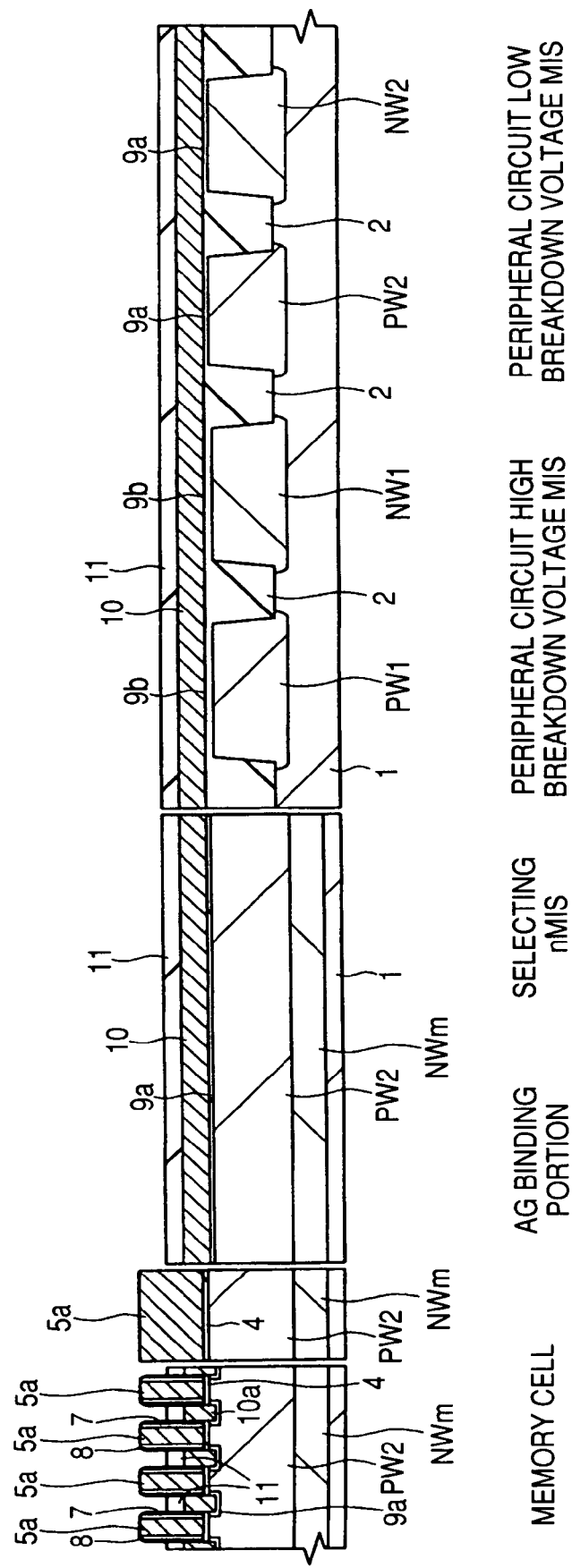
FIG. 14 is a fragmentary cross-sectional view of the same portion as that of FIG. 4 during a manufacturing step of the flash memory following that of FIG. 13.

As illustrated in FIG. 14, the insulating film 6 over the floating gate electrodes 5a is selectively removed by dry etching.

Figure 15:
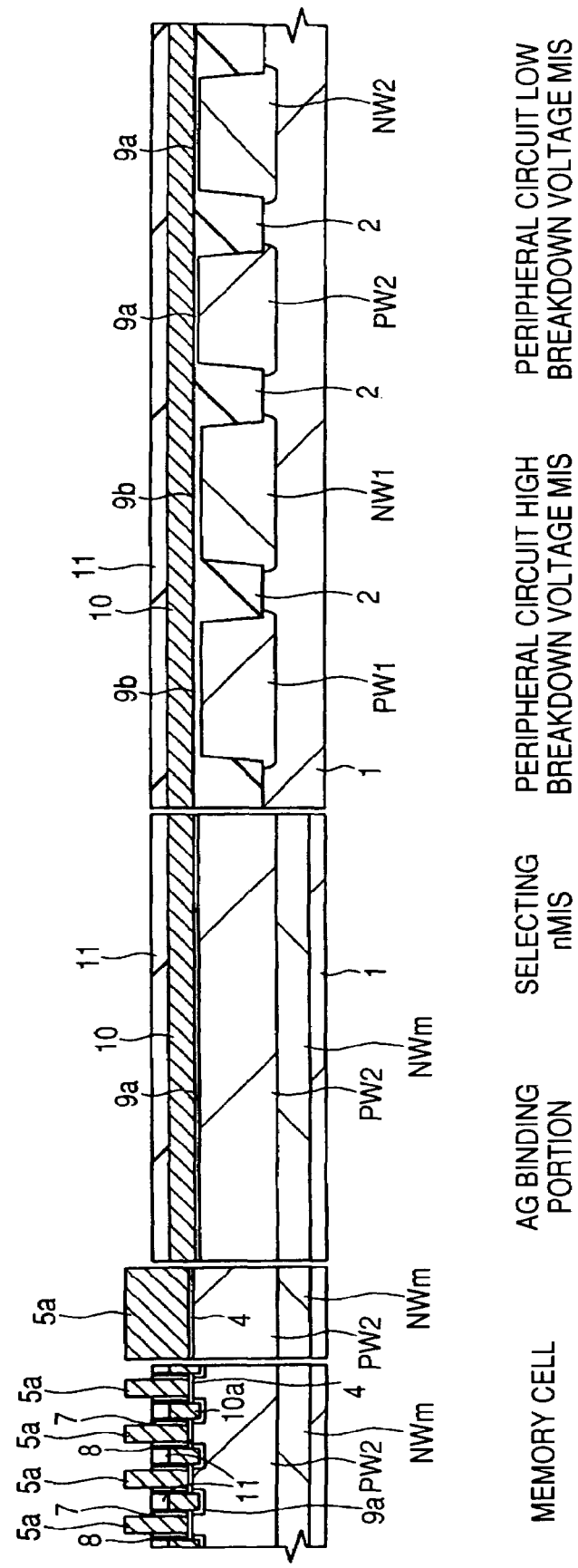
FIG. 15 is a fragmentary cross-sectional view of the same portion as that of FIG. 4 during a manufacturing step of the flash memory following that of FIG. 14.

As illustrated in FIG. 15, the exposed side walls 8 which are formed over the side surfaces of the floating gate electrode 5a are removed by wet etching, followed by removal of the insulating film 7 which is exposed by the removal of the sidewalls 8 by wet etching.

Figure 16:
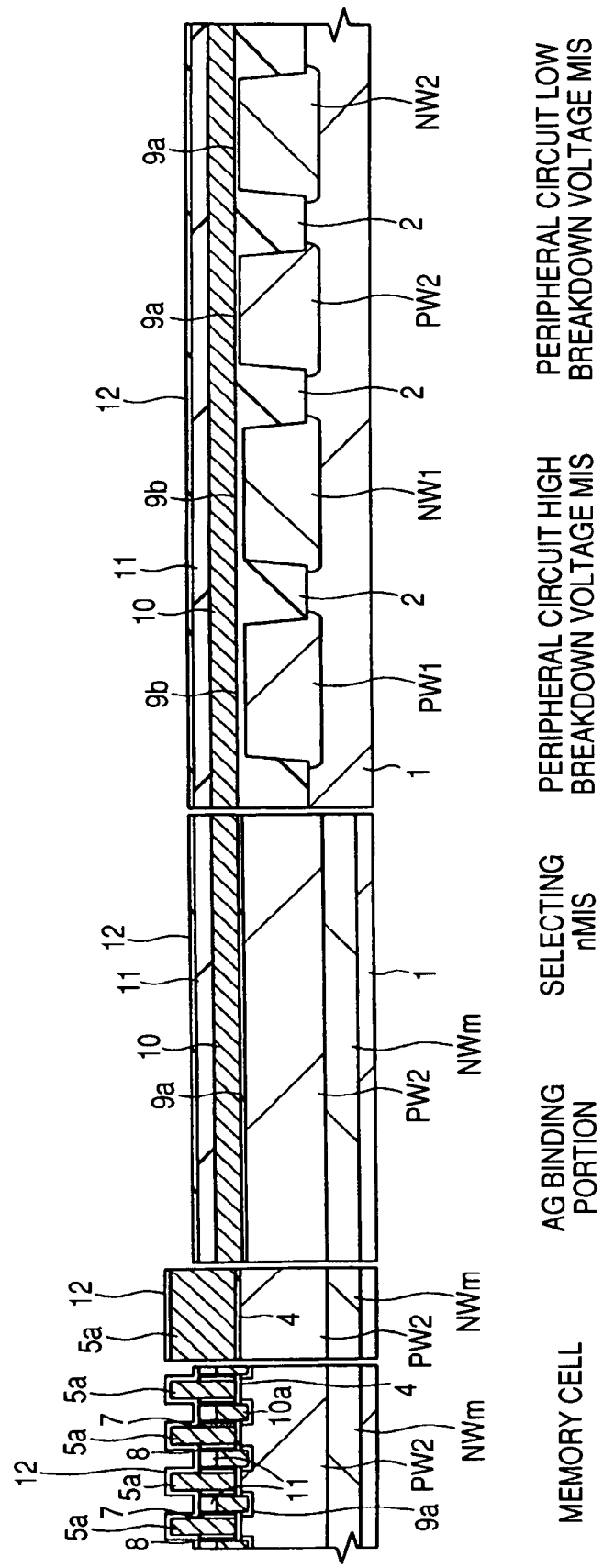
FIG. 16 is a fragmentary cross-sectional view of the same portion as that of FIG. 4 during a manufacturing step of the flash memory following that of FIG. 15.

As illustrated in FIG. 16, an interlayer film 12 is formed by depositing, in the order of mention, a silicon oxide film, a silicon nitride film and a silicon oxide film over the main surface of the semiconductor substrate 1 by CVD.

Figure 17:
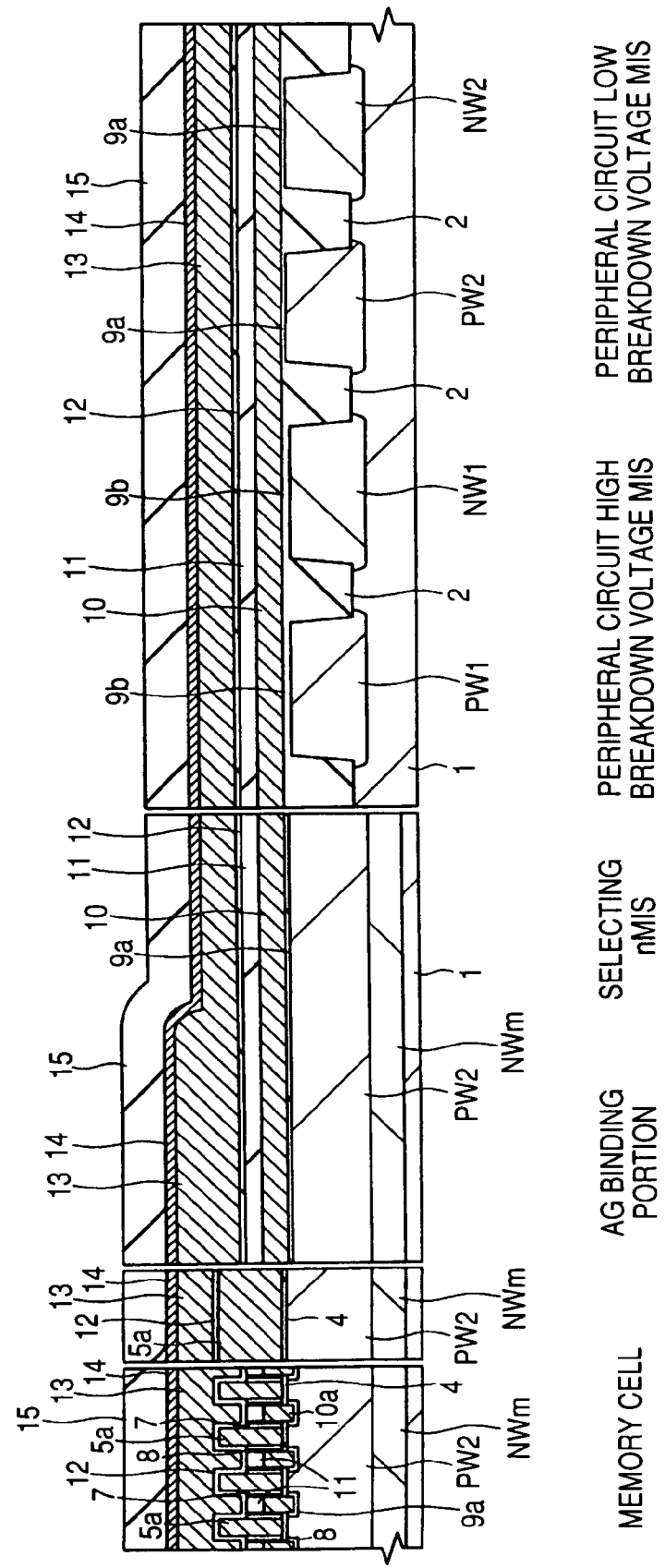
FIG. 17 is a fragmentary cross-sectional view of the same portion as that of FIG. 4 during a manufacturing step of the flash memory following that of FIG. 16.

As illustrated in FIG. 17, a conductor film 13 made of low resistance polycrystalline silicon and having, for example, a thickness of about 150 nm, a conductor film 14 which has lower resistance than the conductor film 13 and having, for example, a film thickness of about 40 nm, and a cap insulating film 15 made of silicon oxide or the like are deposited over the main surface of the semiconductor substrate 1 in the order of mention by CVD. As the conductor film 14, a refractory metal silicide film such as tungsten silicide is employed.

Figure 18:
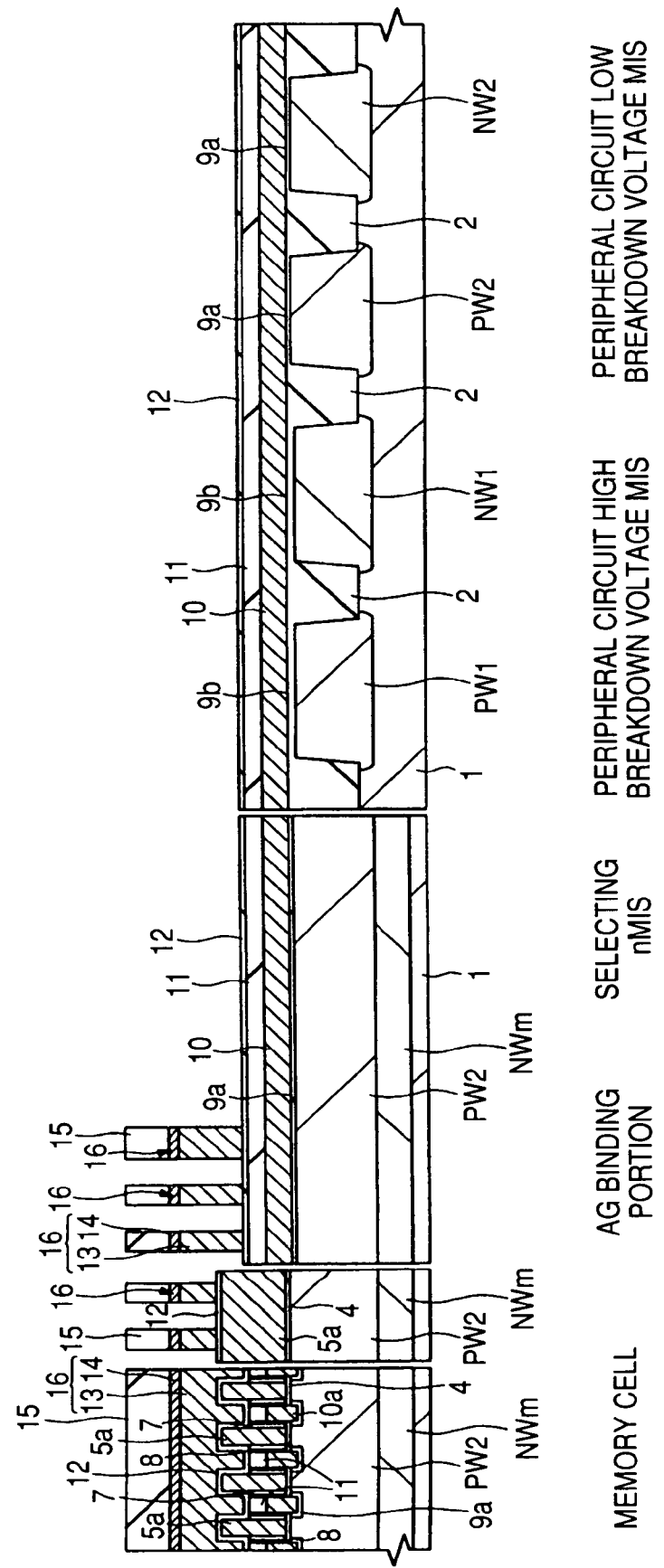
FIG. 18 is a fragmentary cross-sectional view of the same portion as that of FIG. 4 during a manufacturing step of the flash memory following that of FIG. 17.

As illustrated in FIG. 18, with a resist pattern formed by photolithography as a mask, the cap insulating film 15 and conductor films 13 and 14 exposed from the mask are removed by dry etching, whereby control gate electrodes 16 of the memory cell made of the conductor films 13 and 14 are formed.

Figure 19:
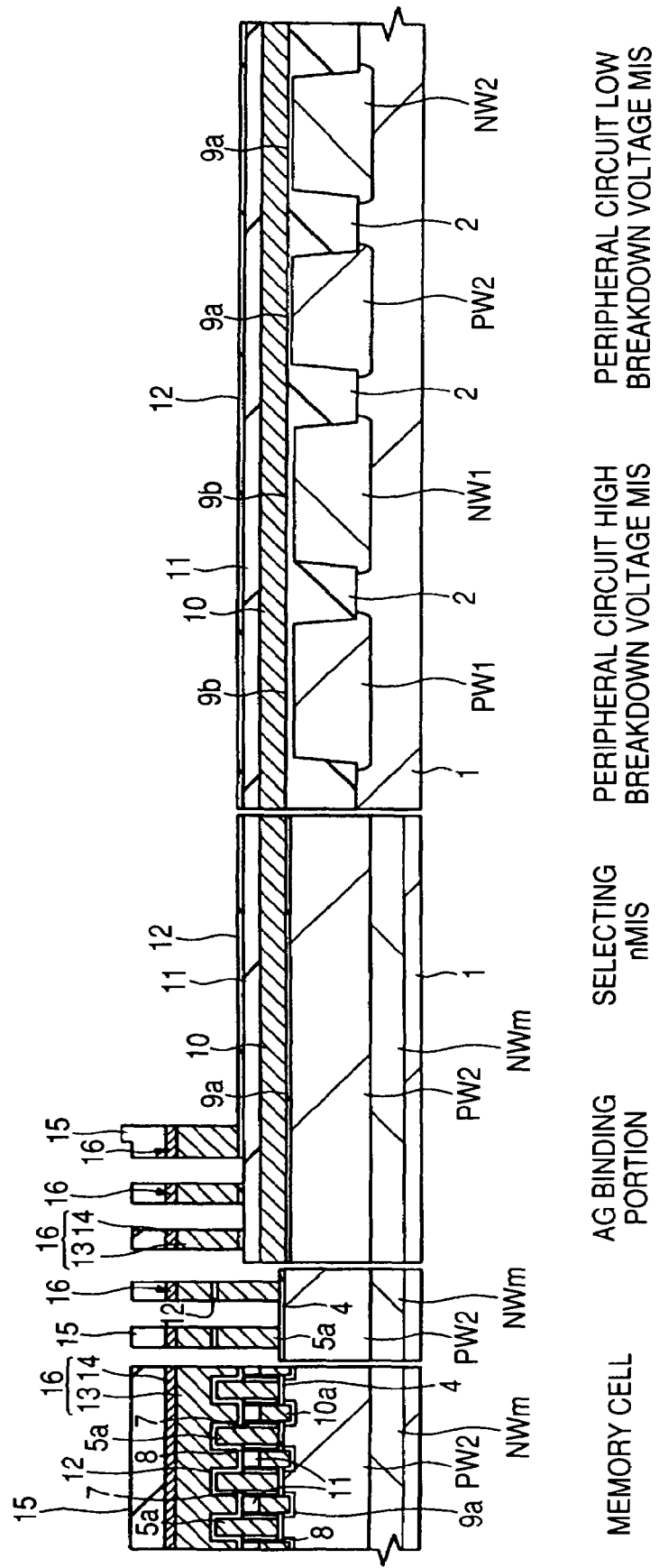
FIG. 19 is a fragmentary cross-sectional view of the same portion as that of FIG. 4 during a manufacturing step of the flash memory following that of FIG. 18.

As illustrated in FIG. 19, with a resist pattern formed by photolithography and remaining cap insulating film 15 as masks, the interlayer film 12 and conductor film 5 exposed therefrom are removed by dry etching, whereby the floating gate electrode 5*a* of the memory cell is patterned in the gate length direction. As a result, the control gate electrode 16 and floating gate electrode 5*a* of the memory cell are completed.

Figure 20:
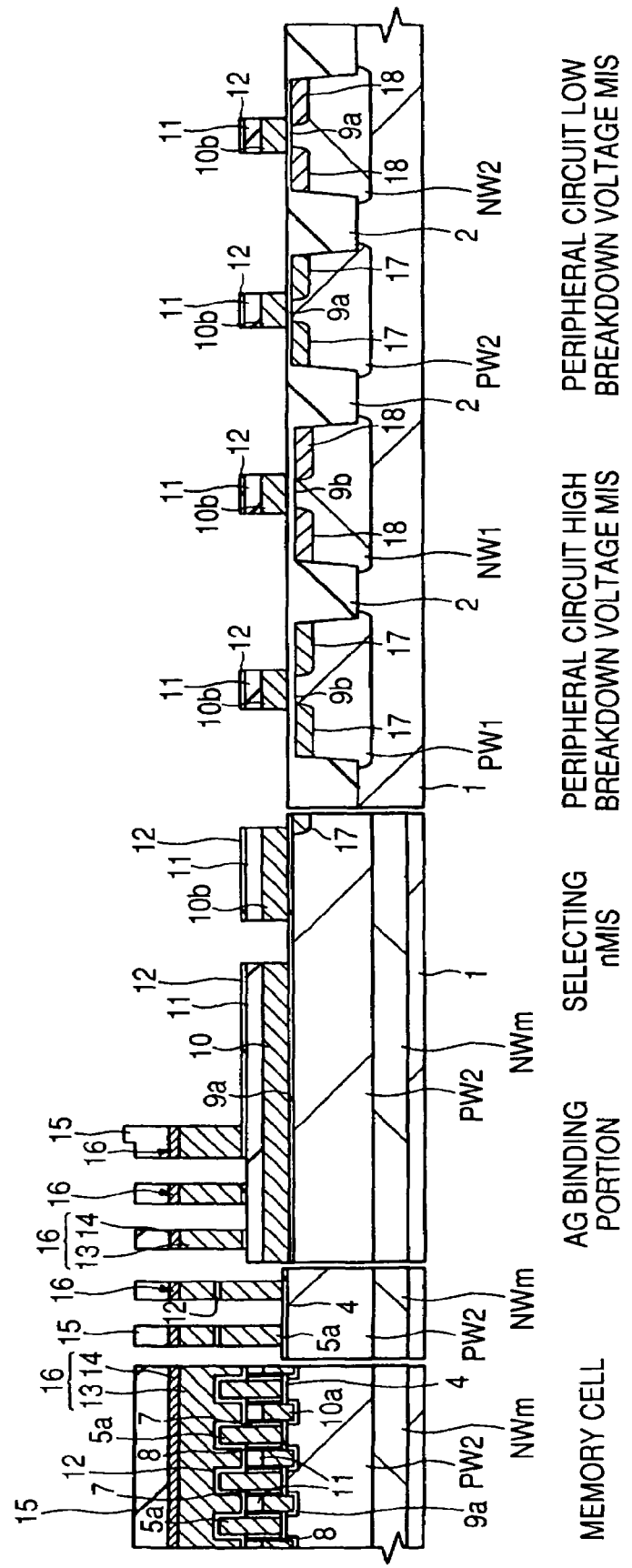
FIG. 20 is a fragmentary cross-sectional view of the same portion as that of FIG. 4 during a manufacturing step of the flash memory following that of FIG. 19.

As illustrated in FIG. 20, with a resist pattern formed by photolithography as a mask, the interlayer film 12, insulating film 11 and conductor film 10 of the peripheral circuit exposed from the mask are removed by dry etching, whereby gate electrodes 10*b* of the selecting nMIS, peripheral circuit high breakdown voltage nMIS and pMIS, and peripheral circuit low breakdown voltage nMIS and pMIS are formed.

A pair of n type semiconductor regions 17 having a relatively low impurity concentration which regions constitute a portion of the source and drain for the selecting nMIS and peripheral circuit high breakdown voltage and low breakdown voltage nMISs are then formed. Into the n type semiconductor regions 17, ions such as arsenic or phosphorus are implanted. A pair of p type semiconductor regions 18 having a relatively low impurity concentration which regions constitute a portion of the source and drain for the peripheral circuit high breakdown voltage and low breakdown voltage pMISs are then formed. Into the p type semiconductor regions 18, ions such as boron or boron fluoride are implanted.

Figure 21:
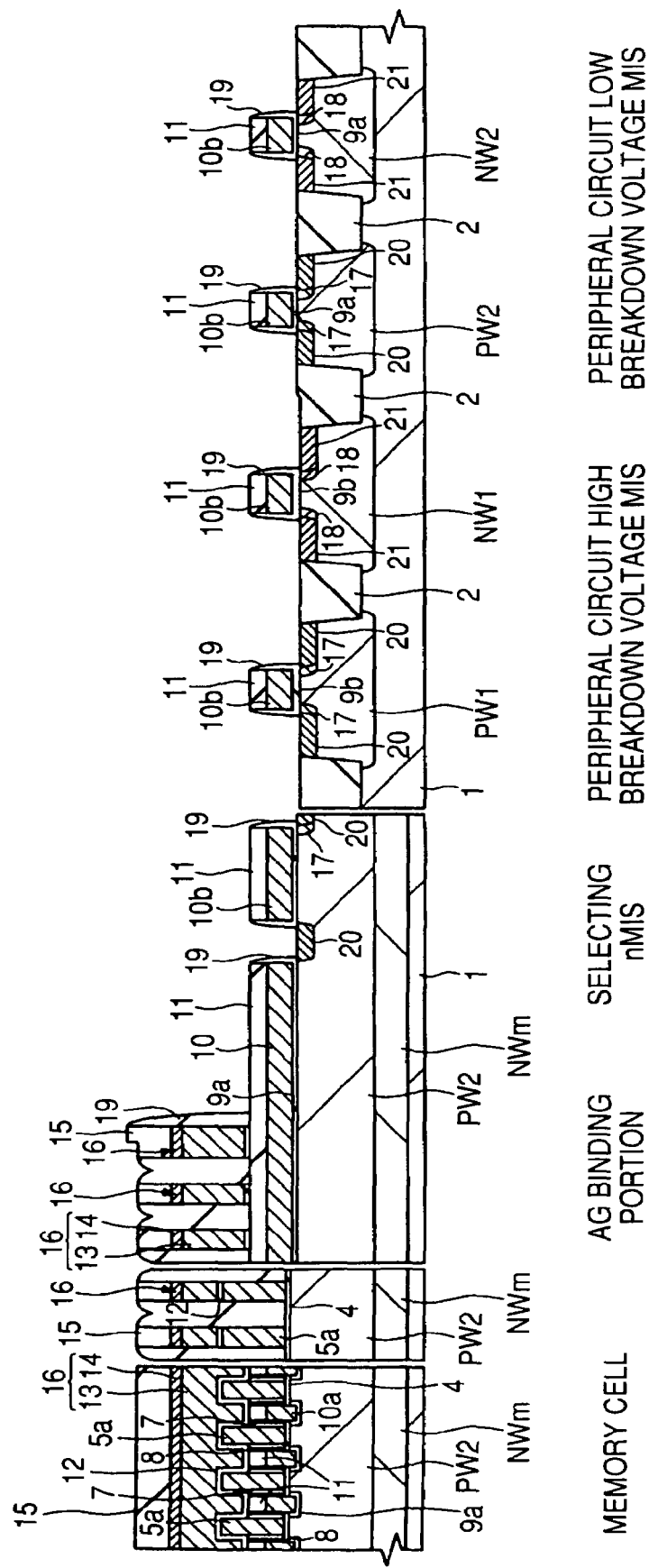
FIG. 21 is a fragmentary cross-sectional view of the same portion as that of FIG. 4 during a manufacturing step of the flash memory following that of FIG. 20.

As illustrated in FIG. 21, after deposition of an insulating film made of, for example, silicon oxide over the main surface of the semiconductor substrate 1 by CVD, the insulating film is etched back by anisotropic dry etching to form side walls over the side surfaces of each of the gate electrodes 10*b* of the selecting nMIS, peripheral circuit high breakdown voltage nMIS and pMIS and peripheral circuit low breakdown voltage nMIS and pMIS. During the formation, the insulating film constituting the sidewalls 19 is also filled between the two adjacent floating gate electrodes 5*a* and between the two adjacent control gate electrodes 16 and it thus insulates between the floating gate electrodes 5*a* and control gate electrodes 16.

A pair of n type semiconductor regions 20 having a relatively high impurity concentration which regions constitute another portion of the source and drain of the selecting nMIS and peripheral circuit high breakdown voltage and low breakdown voltage nMISs and are then formed. In the n type semiconductor regions, arsenic ions, for example, are implanted. A pair of p type semiconductor regions 21 having a relatively high impurity concentration which regions constitute a portion of the source and drain of the peripheral circuit high breakdown voltage and low breakdown voltage pMISs are then formed. Into the p type semiconductor regions 21, boron for example, are ion implanted. In order to activate these impurities thus ion implanted, the semiconductor substrate 1 is subjected to thermal treatment of about 900° C. to 1000° C. By the above-described steps, various MISs of the memory array and peripheral circuit are formed.

Figure 22:
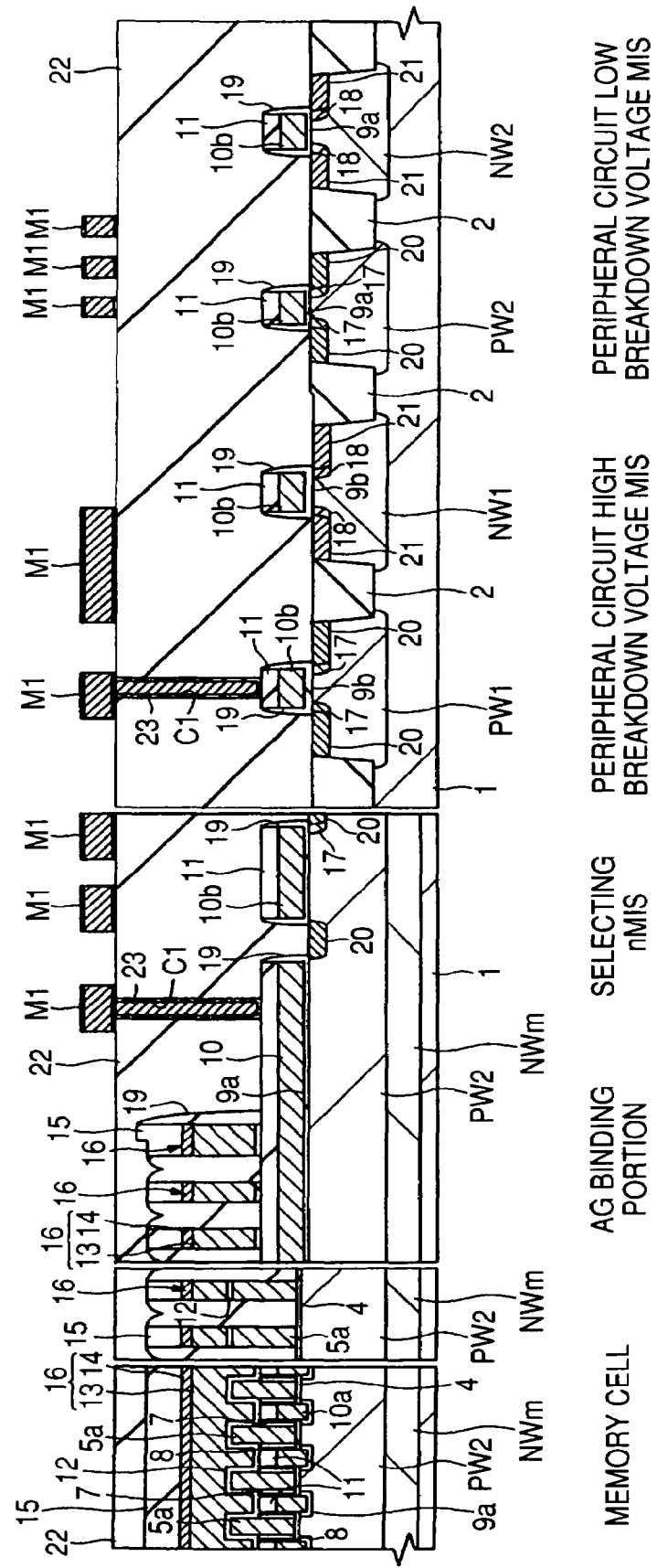
FIG. 22 is a fragmentary cross-sectional view of the same portion as that of FIG. 4 during a manufacturing step of the flash memory following that of FIG. 21.

As illustrated in FIG. 22, an insulating film 22 made of, for example, silicon oxide is deposited over the main surface of the semiconductor substrate 1 by CVD. With a resist pattern formed by photolithography as a mask, the insulating film 22 exposed therefrom is removed by dry etching to form contact holes C1 from which portions (for example, memory cell and source and drain of various MISs) of the semiconductor substrate 1 and a portion of the word lines WL are exposed.

After deposition of, for example, a titanium film, a titanium nitride film and a tungsten film over the main surface of the semiconductor substrate 1 in the order of mention by sputtering or CVD, these metal films are polished by CMP to leave them only inside of the contact hole C1, whereby a plug 23 is formed inside of the contact hole C1. Over the main surface of the semiconductor substrate 1, an aluminum alloy film and a titanium nitride film, for example, are deposited in the order of mention by sputtering. With a resist pattern formed by photolithography as a mask, the titanium nitride film and aluminum alloy film exposed therefrom are removed by dry etching to form a first-level interconnect M1.

Figure 23:
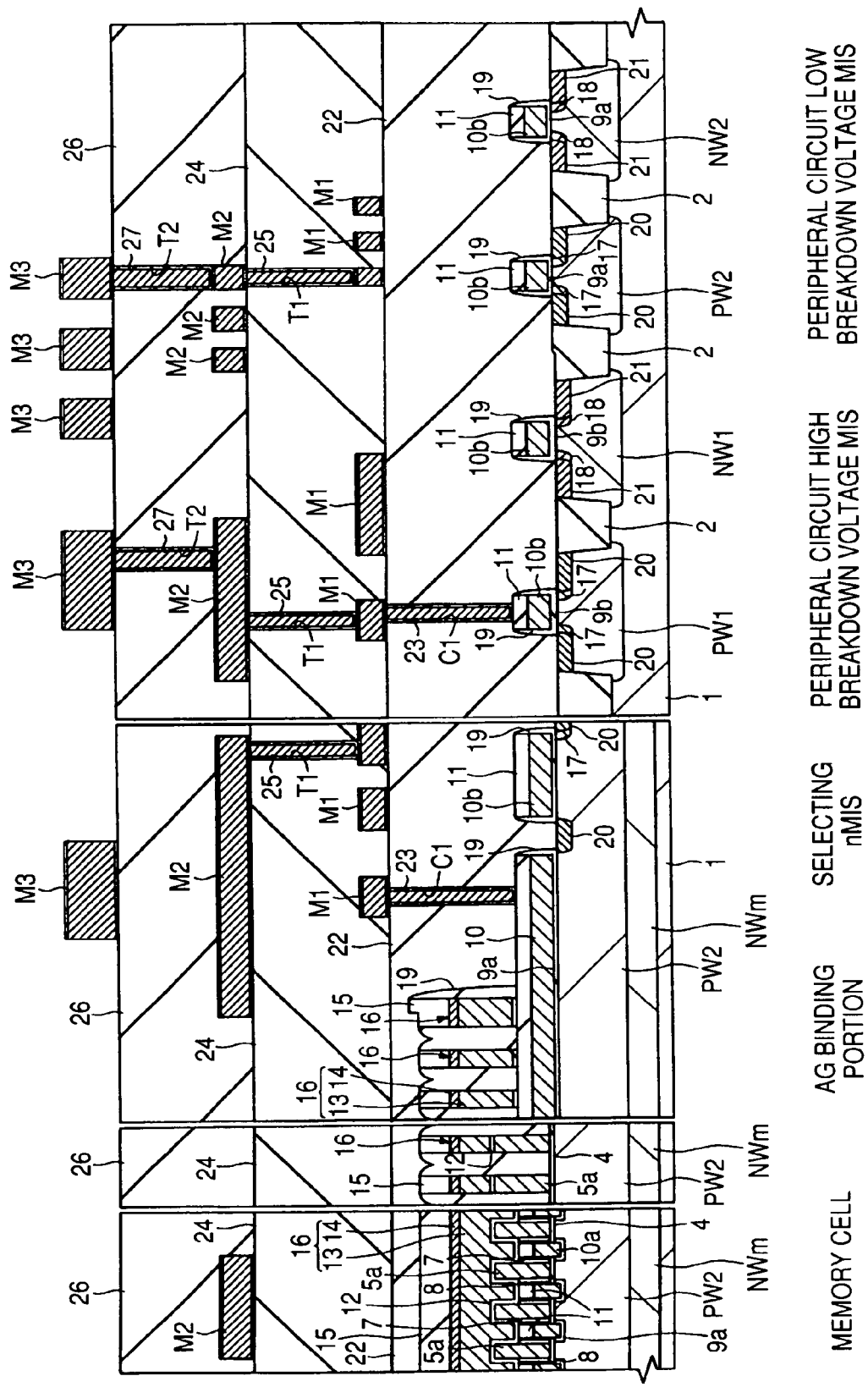
FIG. 23 is a fragmentary cross-sectional view of the same portion as that of FIG. 4 during a manufacturing step of the flash memory following that of FIG. 22.

As illustrated in FIG. 23, an insulating film 24 made of, for example, silicon oxide is deposited by CVD over the main surface of the semiconductor substrate 1. With a resist pattern formed by photolithography as a mask, the insulating film 24 exposed therefrom is removed by dry etching, whereby a through-hole T1 from which a portion of the first-level interconnect M1 is exposed is formed in the insulating film 24.

After deposition of, for example, a titanium film, a titanium nitride film and a tungsten film over the main surface of the semiconductor substrate 1 in the order of mention by sputtering or CVD, these metal films are polished by CMP to leave them only inside of the contact hole T1, whereby a plug 25 is formed inside of the contact hole T1. Over the main surface of the semiconductor substrate 1, an aluminum alloy film and a titanium nitride film, for example, are deposited in the order of mention by sputtering. With a resist pattern formed by photolithography as a mask, the titanium nitride film and aluminum alloy film exposed therefrom were removed by dry etching to form a second-level interconnect M2. The second-level interconnect M2 is electrically connected to the first-level interconnect M1 via the plug 25.

After deposition of an insulating film 26 made of, for example, silicon oxide over the main surface of the semiconductor substrate 1 by CVD, a through-hole T2 from which a portion of the second-level interconnect M2 is exposed is formed in the insulating film 26 in a similar manner to that employed for the formation of the through-hole T1. A plug 27 is formed inside of the through-hole T2 in a similar manner to that employed for the formation of the plug 25 and second-level interconnect M2. In such a manner, a third-level interconnect M3 electrically connected to the second-level interconnect M2 via the plug 27 is formed.

Upper-level interconnects are thereafter formed. The surface of the uppermost-level interconnect is covered with a surface protection film. An opening portion from which a portion of the upper-most level interconnect is exposed is formed and a bonding pad is formed, whereby a flash memory is manufactured.

According to Embodiment 1, a tunnel insulating film of a memory cell having high reliability can be obtained by forming the insulating film 4 serving as a tunnel insulating film of a memory cell over the main surface of the semiconductor substrate 1 which is clean and damage free, forming the floating gate electrode 5a and then forming the assist gate electrode 10a. This enables formation of a memory cell with high reliability.

Embodiment 2

One example of a manufacturing method of an AG-AND flash memory according to Embodiment 2 will next be described in the order of steps based on the fragmentary cross-sectional views of a semiconductor substrate in FIGS. 24 to 39. What is different from the above-described Embodiment 1 is that an insulating film functioning as a tunnel insulating film of a memory cell and a gate insulating film of peripheral circuit low breakdown voltage nMIS and pMIS are formed as the same layer and a floating gate electrode of a memory cell and gate electrodes of various MISs of a peripheral circuit are formed as the same layer.

As in the above-described Embodiment 1, an isolation portion 2 and an active region encompassed therewith are formed over the main surface of a semiconductor substrate 1. Then, a buried n well NWm, p wells PW1 and PW2, and n wells NW1 and NW2 are formed in predetermined portions of the semiconductor substrate 1.

Figure 24:
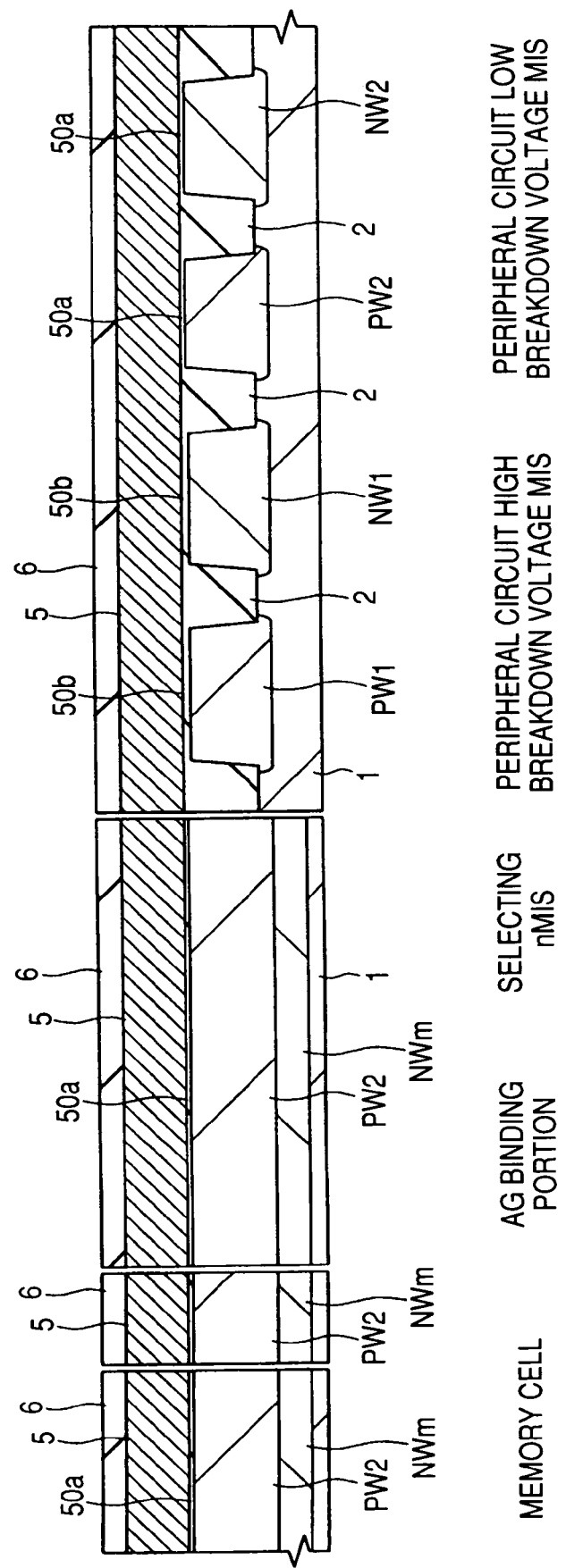
FIG. 24 is a fragmentary cross-sectional view of an AG-AND flash memory according to Embodiment 2 of the present invention during its manufacturing step.

As illustrated in FIG. 24, an insulating film 50a of about 8 nm to 10 nm in thickness and an insulating film 50b of about 25 nm in thickness are formed over the main surface of the semiconductor substrate 1. The insulating film 50a serves, for example, as a tunnel insulating film of a memory cell and moreover, constitutes a gate insulating film of a selecting nMIS, and peripheral circuit low breakdown voltage nMIS and pMIS. The insulating film 50b constitutes, for example, peripheral circuit high breakdown voltage nMIS and pMIS. These insulating films 50a and 50b are formed using, for example, ISSG oxidation in a similar step to that employed for the formation of the insulating films 9a and 9b as described in Embodiment 1.

After deposition of a conductor film 5 of, for example, about 250 nm in thickness made of low resistance polycrystalline silicon over the main surface of the semiconductor substrate 1, an insulating film 6 of, for example, about 100 nm in thickness made of silicon oxide is deposited over the conductor film 5 by CVD (Chemical Vapor Deposition).

Figure 25:
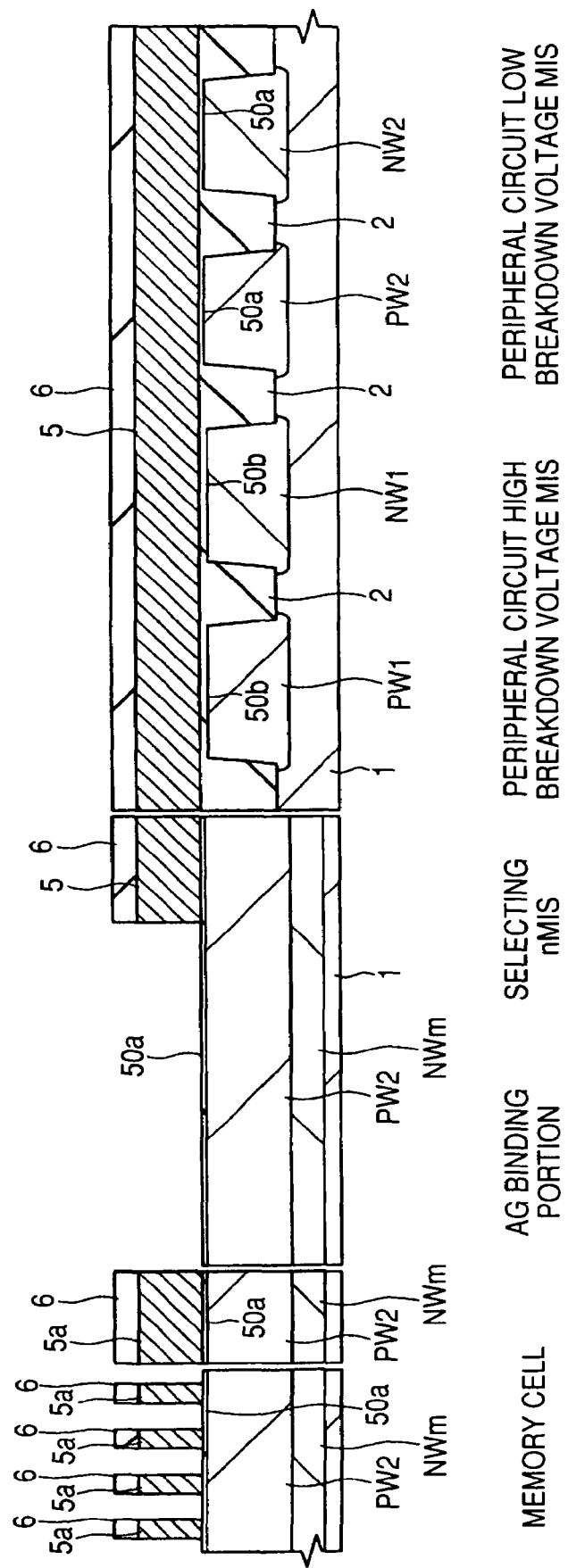
FIG. 25 is a fragmentary cross-sectional view of the same portion as that of FIG. 24 during a manufacturing step of the flash memory following that of FIG. 24.

As illustrated in FIG. 25, with a resist pattern formed by photolithography as a mask, the insulating film 6 and conductor film 5 exposed therefrom are removed by dry etching, whereby floating gate electrodes 5a of the memory cell made of the conductor film 5 are patterned in a gate width direction. At the same time, unnecessary portions of the insulating film 6 and conductor film 5 are removed from the assist gate electrode binding portion while leaving the conductor film and insulating film 6 in the selecting nMIS and peripheral circuit formation regions.

As in the above-described Embodiment 1, the floating gate electrodes 5a are disposed over the main surface of the semiconductor substrate 1 via the insulating film 50a functioning as a tunnel insulating film of the memory cell. This insulating film 50a is formed over the main surface of the semiconductor substrate 1 which is clean and damage-free, for example, by ISSG oxidation and the conductor film 5 is deposited over the insulating film 50a by thermal CVD which causes less damage so that a tunnel insulating film with high reliability can be obtained.

In the flash memory, the gate insulating films of the peripheral circuit high breakdown voltage nMIS and pMIS are required to have high reliability next to that of the memory cell, because the peripheral circuit high breakdown voltage nMIS and pMIS are used mainly for a circuit having a relatively long operation time such as power supply circuit or a decoder circuit and a stress is therefore applied to the gate insulating film for long hours. In Embodiment 2, however, since gate insulating films of the high breakdown voltage nMIS and pMIS are made of the insulating film 50b formed over the main surface of the semiconductor substrate 1 which is clean and damage free, a gate insulating film with high reliability is available. The insulating film 50a also constitutes the gate insulating films of the peripheral circuit low breakdown voltage nMIS and pMIS used mainly for a logic circuit so that a similar advantage can be obtained.

Figure 26:
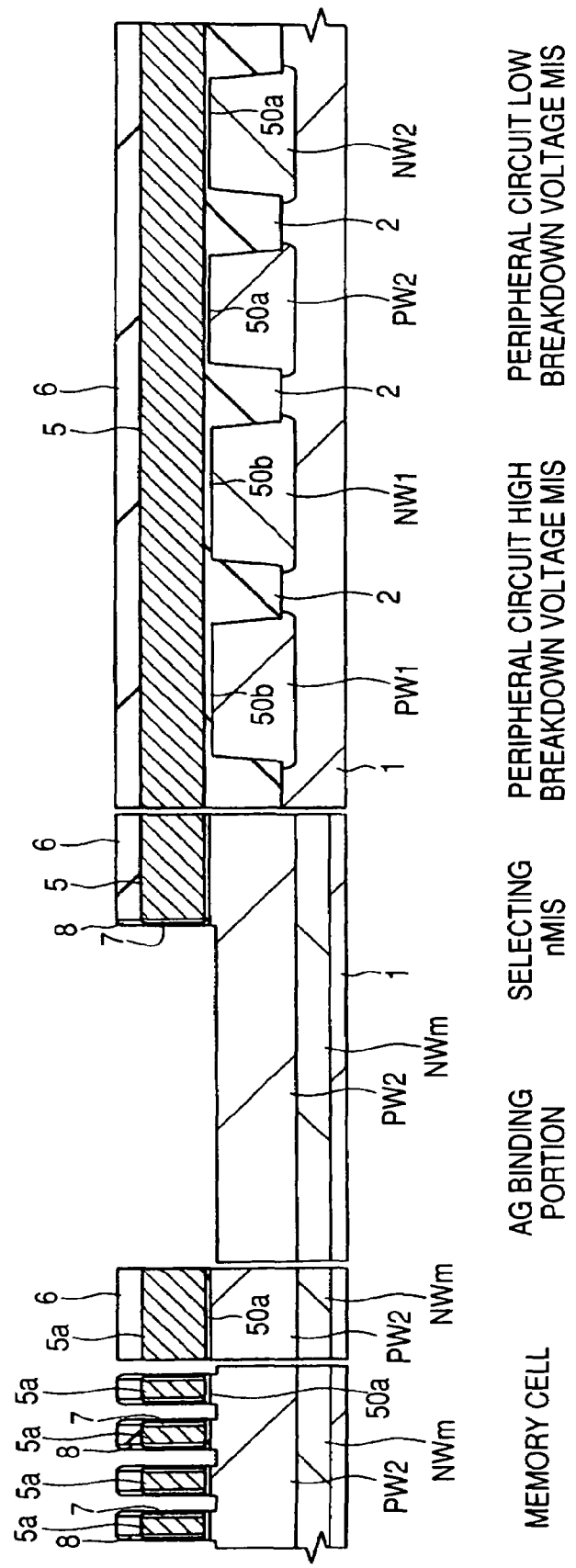
FIG. 26 is a fragmentary cross-sectional view of the same portion as that of FIG. 24 during a manufacturing step of the flash memory following that of FIG. 25.

As illustrated in FIG. 26, the semiconductor substrate 1 is subjected to thermal oxidation treatment to form an insulating film 7 made of silicon oxide over the side surfaces of the floating gate electrode 5a. Then, sidewalls 8 are formed over the side surfaces of the floating gate electrode 5a and insulating film 6. During the formation of the sidewalls 8, a damage layer such as dislocation or crystal defects is formed in single crystal silicon constituting the semiconductor substrate 1. The surface of the semiconductor substrate 1 is therefore etched by about 10 nm by, for example, dry etching to remove the damage layer. Since the damage layer is thus removed in advance, defects between an assist gate insulating film 9a which will be formed later and semiconductor substrate 1 can be removed.

Figure 27:
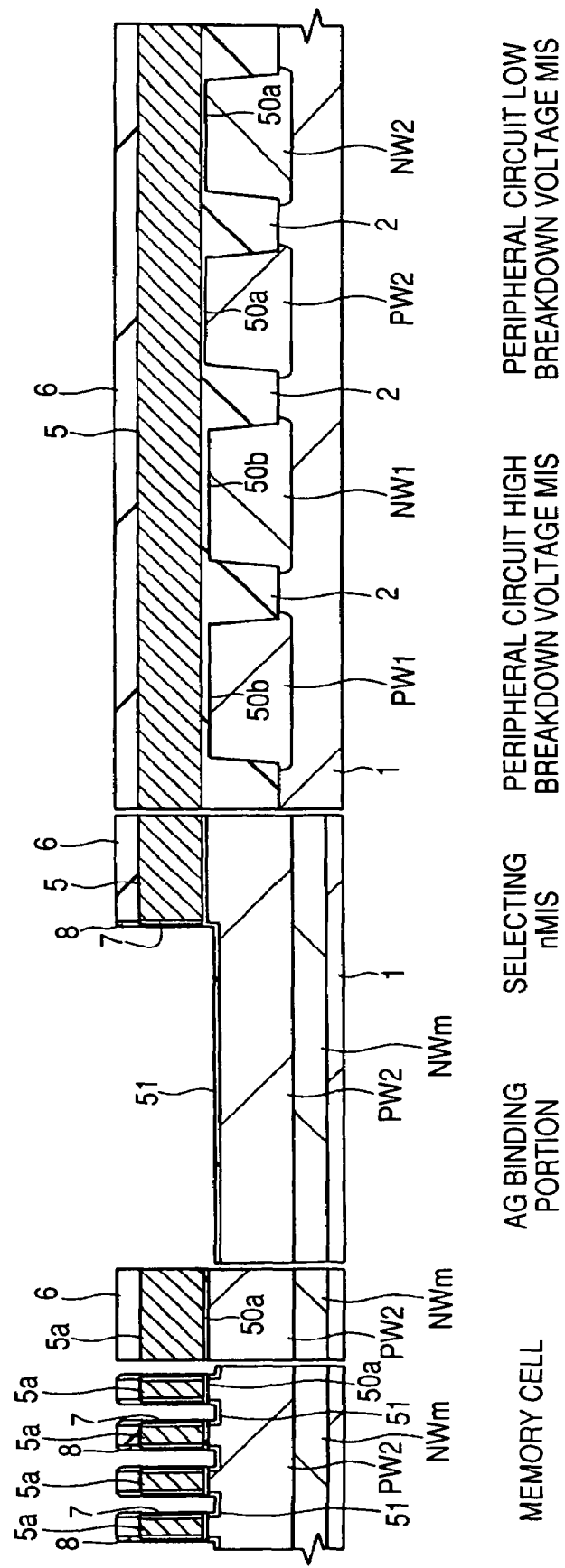
FIG. 27 is a fragmentary cross-sectional view of the same portion as that of FIG. 24 during a manufacturing step of the flash memory following that of FIG. 26.

As illustrated in FIG. 27, an insulating film 51 of from about 8 nm to 10 nm in thickness which constitutes an assist gate insulating film of the memory cell is formed over the main surface of the semiconductor substrate 1 by thermal oxidation.

Figure 28:
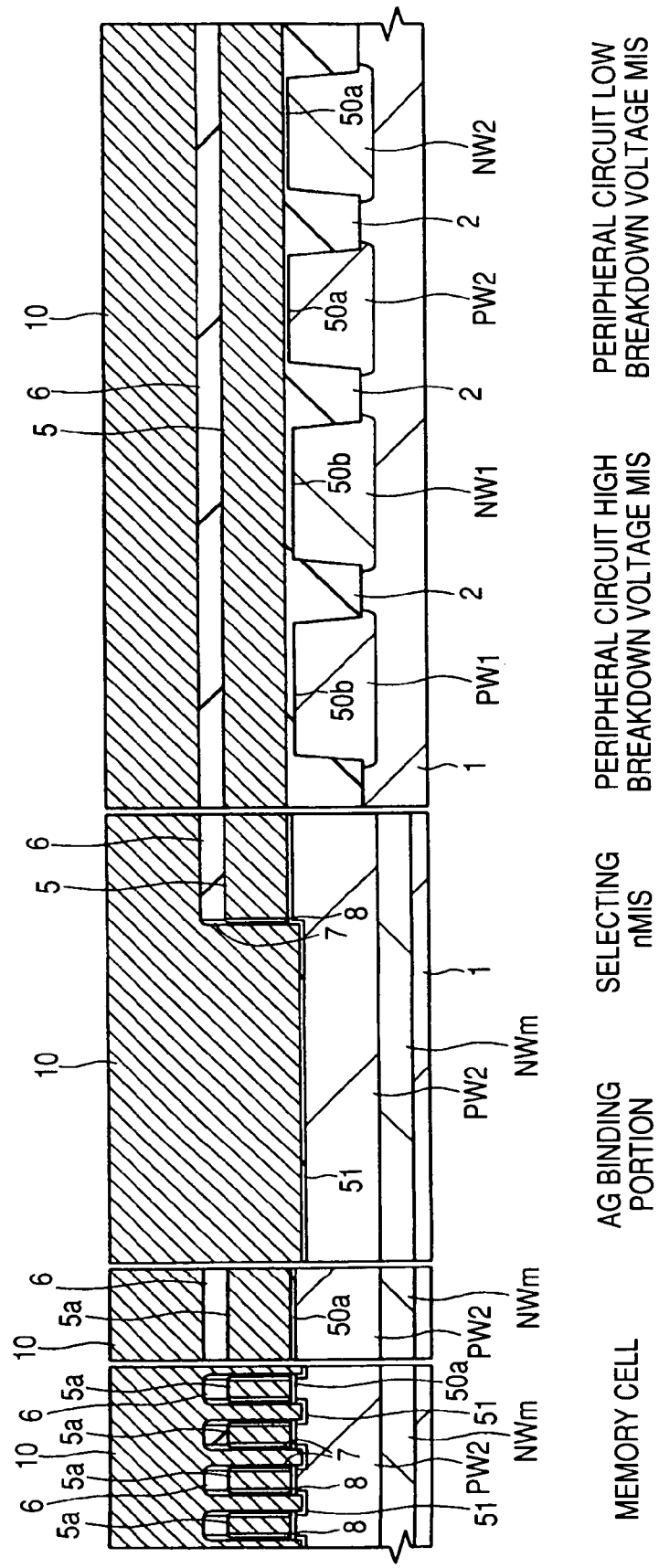
FIG. 28 is a fragmentary cross-sectional view of the same portion as that of FIG. 24 during a manufacturing step of the flash memory following that of FIG. 27.

As illustrated in FIG. 28, a conductor film 10 of, for example, from about 90 nm to 100 nm in thickness made of low resistance polycrystalline silicon is deposited over the main surface of the semiconductor substrate 1. Since the distance between two adjacent floating gate electrodes 5a is, for example, about 90 nm, the space between the two adjacent floating gate electrodes 5a can be filled with the conductor film 10.

Figure 29:
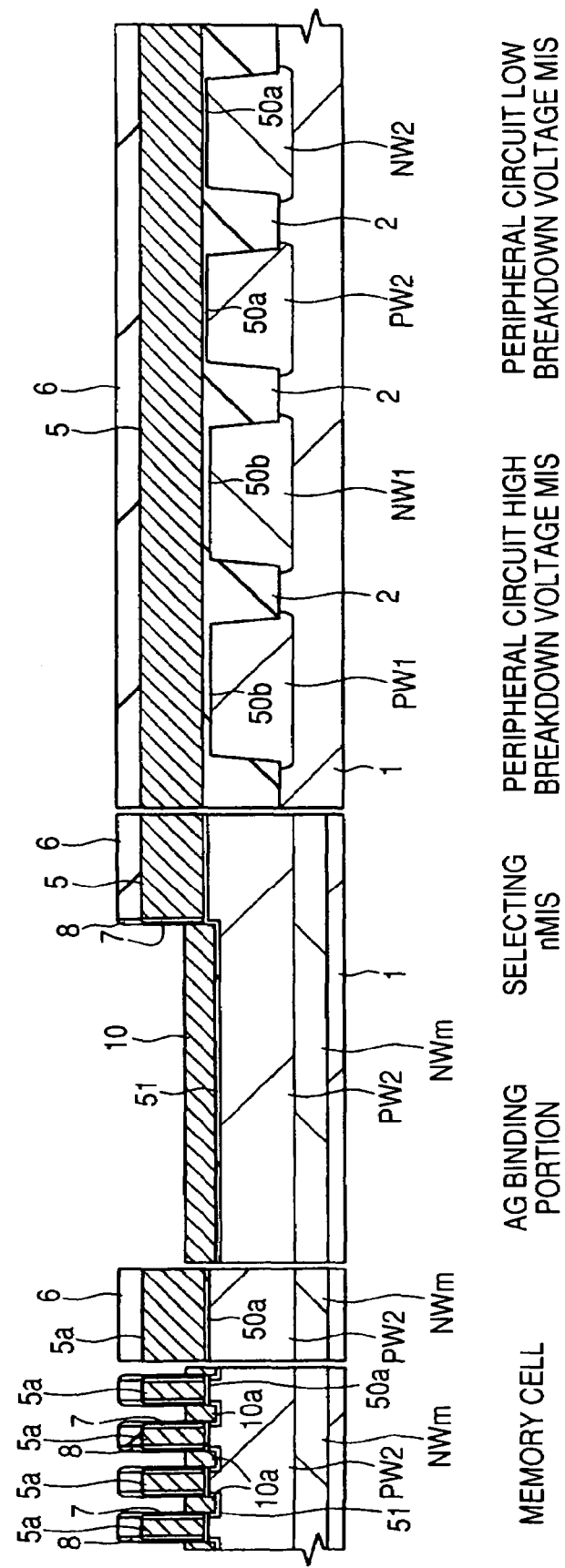
FIG. 29 is a fragmentary cross-sectional view of the same portion as that of FIG. 24 during a manufacturing step of the flash memory following that of FIG. 28.

As illustrated in FIG. 29, an unnecessary portion of the conductor film 10 is removed by dry etching, whereby the assist gate electrodes 10a of the memory cell made of the conductor film 10 are patterned in the gate width direction.

Figure 30:
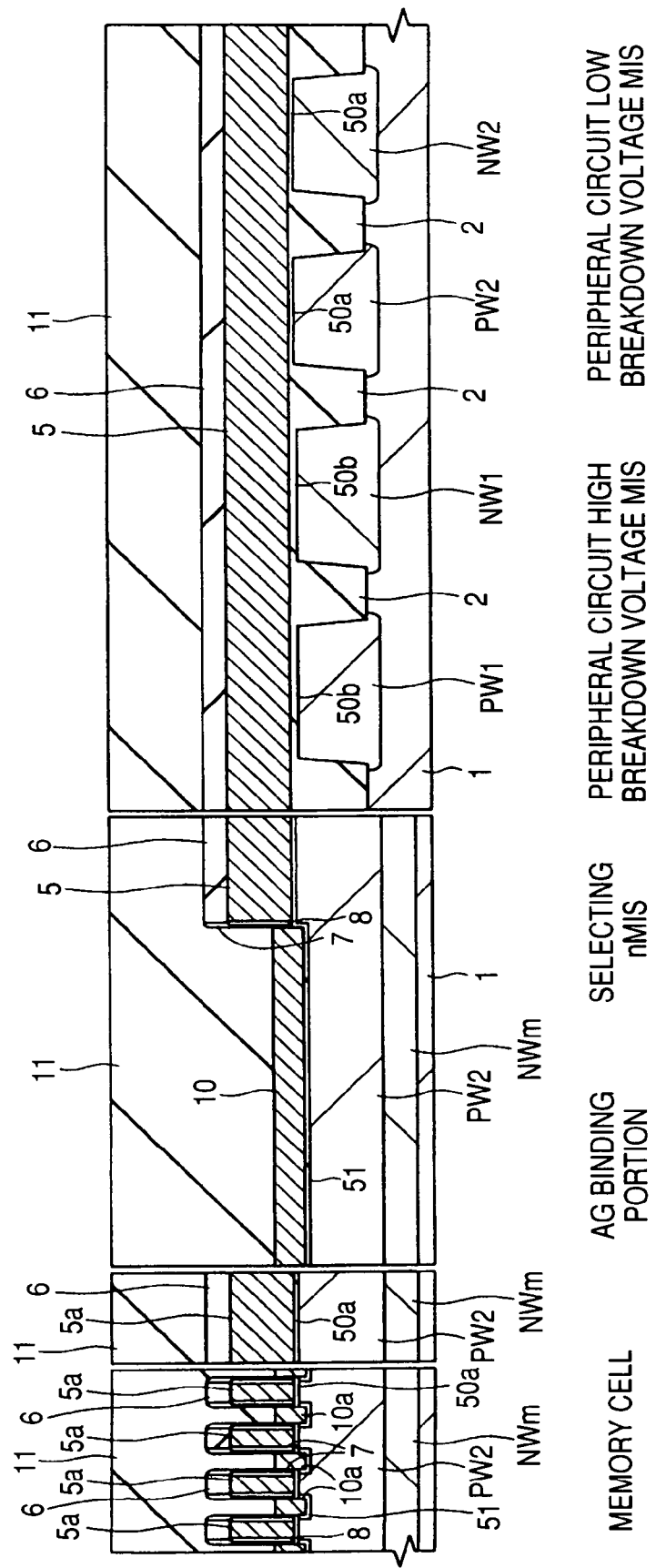
FIG. 30 is a fragmentary cross-sectional view of the same portion as that of FIG. 24 during a manufacturing step of the flash memory following that of FIG. 29.

As illustrated in FIG. 30, an insulating film 11 of, for example, from about 90 nm to 100 nm in thickness made of silicon nitride is deposited over the main surface of the semiconductor substrate 1. Since the distance between two adjacent floating gate electrodes 5a is, for example, about 90 nm, the space between the two adjacent floating gate electrodes 5a can be filled with the insulating film 11.

Figure 31:
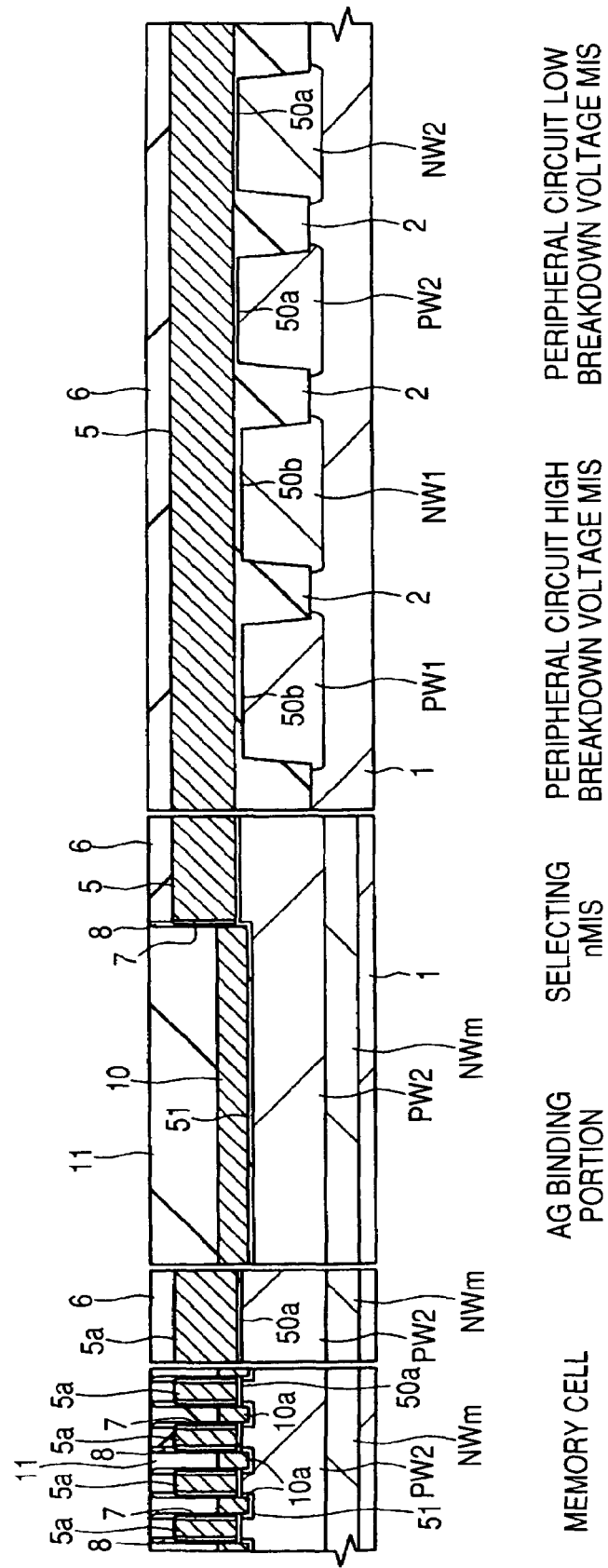
FIG. 31 is a fragmentary cross-sectional view of the same portion as that of FIG. 24 during a manufacturing step of the flash memory following that of FIG. 30.

As illustrated in FIG. 31, the insulating film 11 is etched back by dry etching until the exposure of the insulating film 6. The insulating film 11 is filled between the two adjacent assist gate electrodes 10a of the memory cell and the surface of the insulating film 11 is then planarized.

Figure 32:
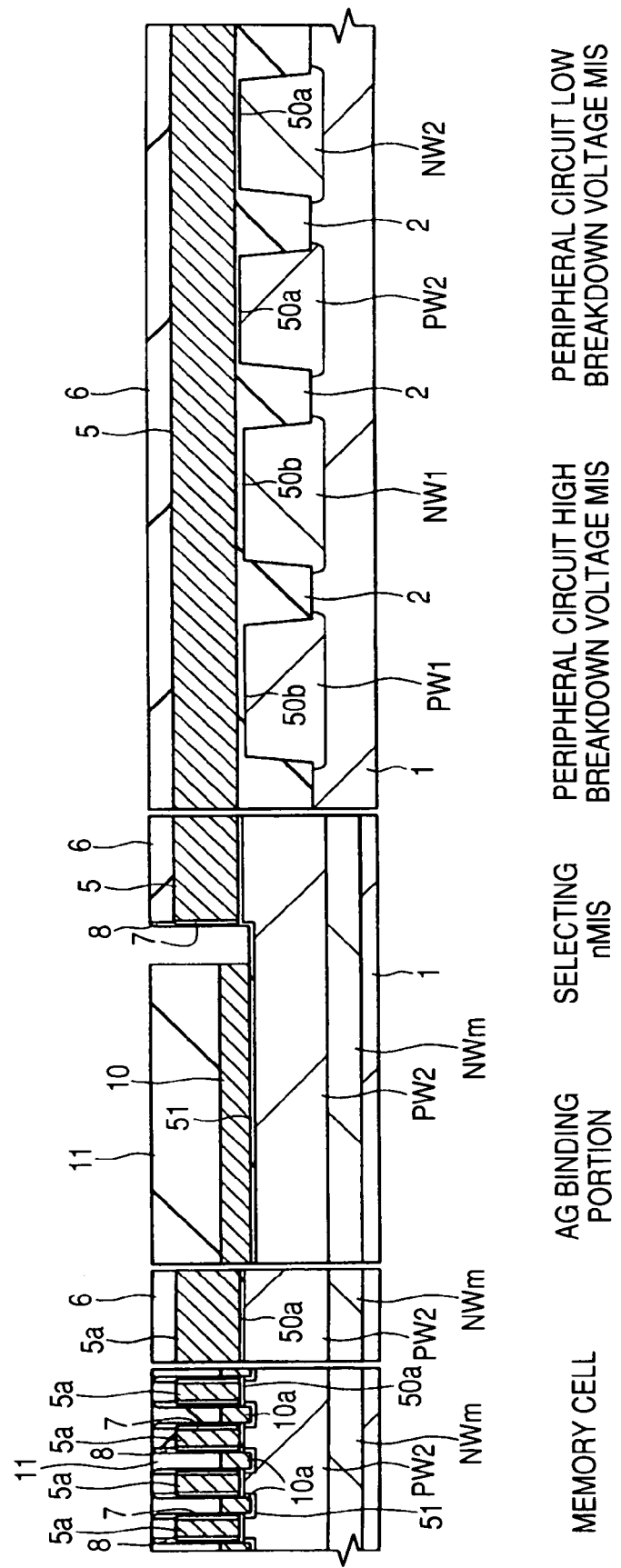
FIG. 32 is a fragmentary cross-sectional view of the same portion as that of FIG. 24 during a manufacturing step of the flash memory following that of FIG. 31.

As illustrated in FIG. 32, with a resist pattern formed by photolithography as a mask, the insulating film 11 and conductor film 10 exposed therefrom and existing at the end portions of the assist gate electrode binding portion are removed by dry etching.

Figure 33:
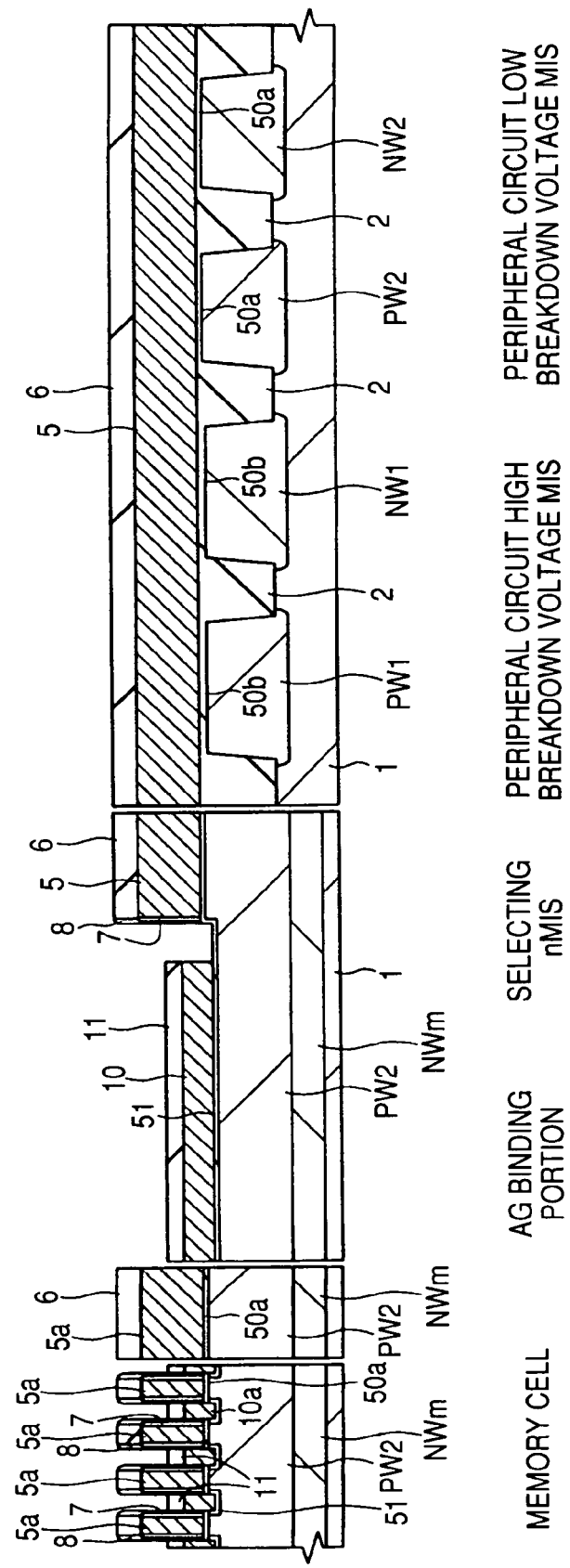
FIG. 33 is a fragmentary cross-sectional view of the same portion as that of FIG. 24 during a manufacturing step of the flash memory following that of FIG. 32.

As illustrated in FIG. 33, with a resist pattern formed by photolithography as a mask, an unnecessary portion of the insulating film 11 exposed therefrom is removed by wet etching, whereby the insulating film 11 of for example, about 80 nm in thickness can be left over the assist gate electrodes 10a of the memory cell.

Figure 34:
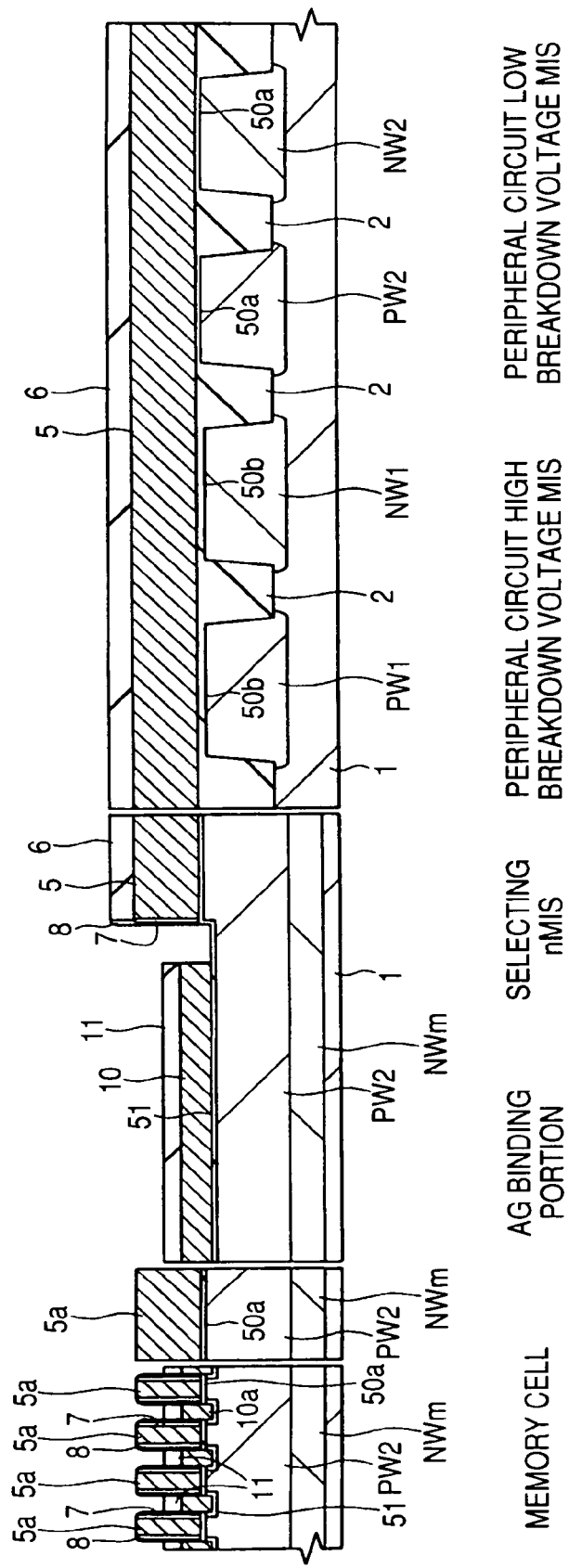
FIG. 34 is a fragmentary cross-sectional view of the same portion as that of FIG. 24 during a manufacturing step of the flash memory following that of FIG. 33.

As illustrated in FIG. 34, the insulating film 6 over the floating gate electrode 5a is selectively removed by dry etching.

Figure 35:
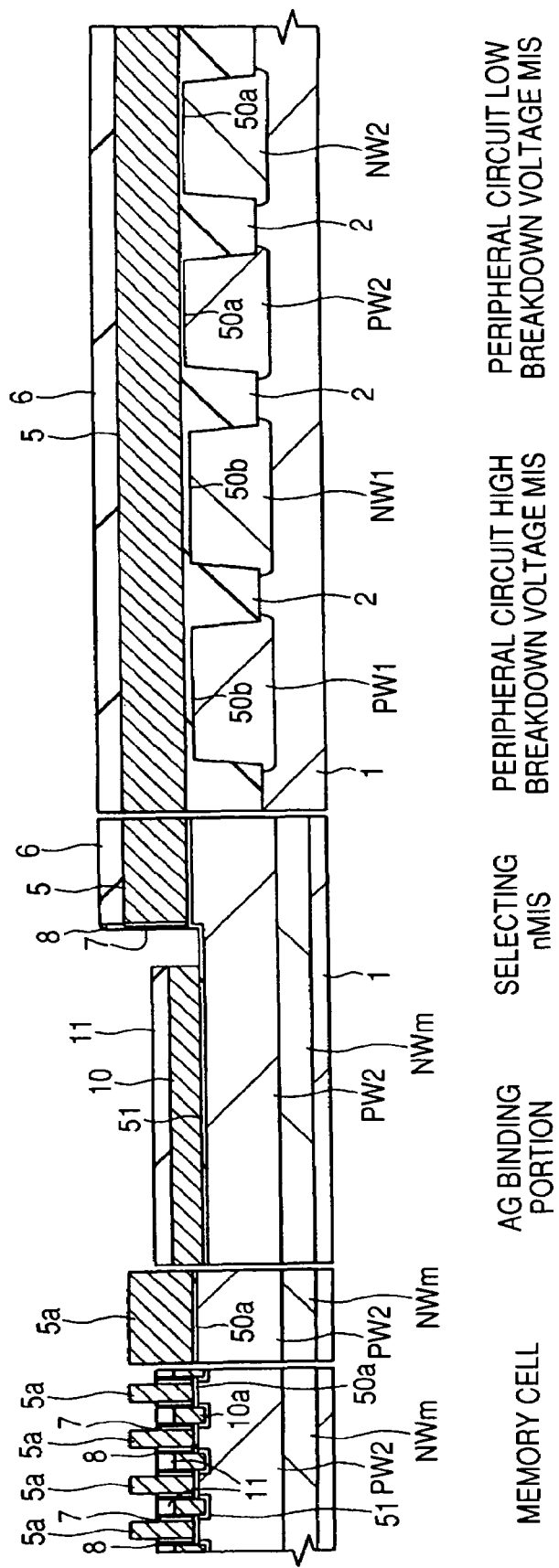
FIG. 35 is a fragmentary cross-sectional view of the same portion as that of FIG. 24 during a manufacturing step of the flash memory following that of FIG. 34.

As illustrated in FIG. 35, the exposed sidewalls 8 formed over the side surface of the floating gate electrodes 5a are removed by wet etching, followed by wet etching to remove the insulating film 7 exposed by the removal of the sidewalls 8.

Figure 36:
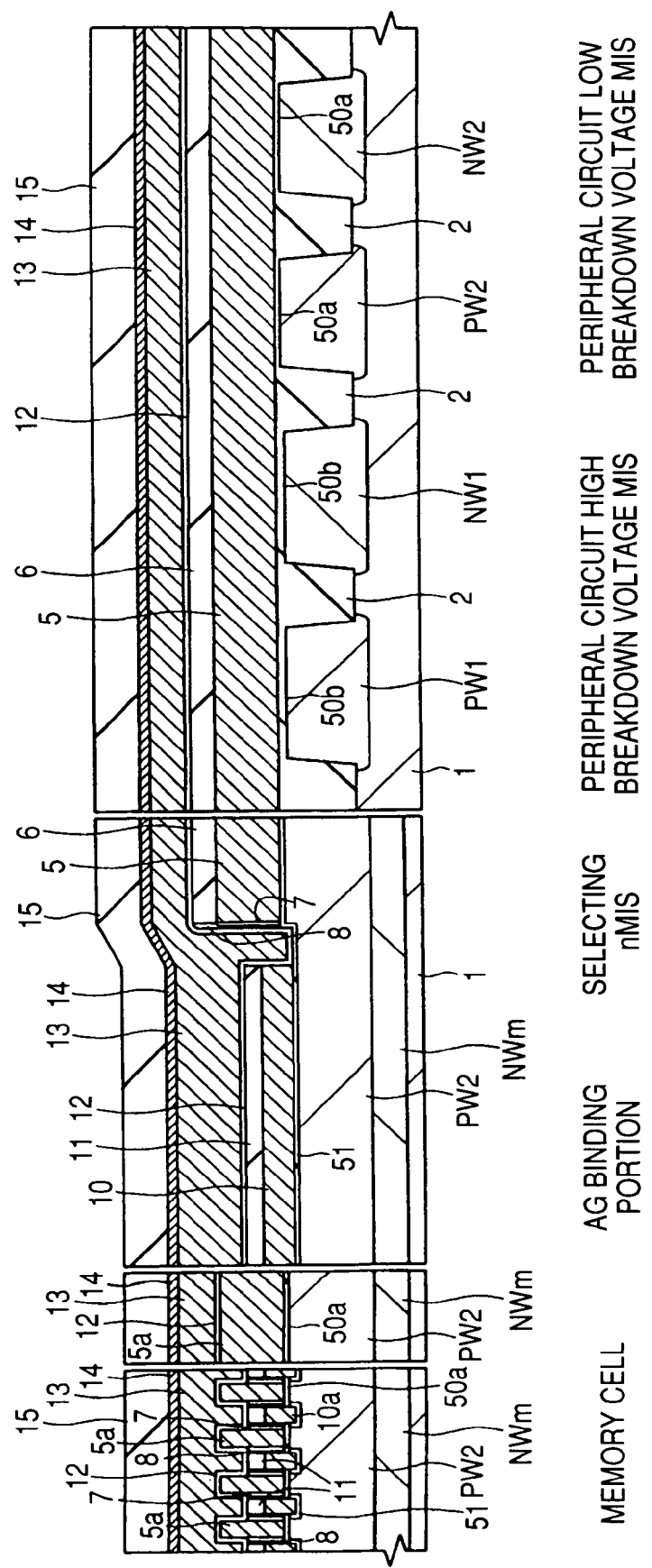
FIG. 36 is a fragmentary cross-sectional view of the same portion as that of FIG. 24 during a manufacturing step of the flash memory following that of FIG. 35.

As illustrated in FIG. 36, an interlayer film 12 is formed by depositing, for example, a silicon oxide film, a silicon nitride film and a silicon oxide film in the order of mention over the main surface of the semiconductor substrate 1 by CVD. Then over the main surface of the semiconductor substrate 1, a conductor film 13 of, for example, about 150 nm in thickness made of low resistance polycrystalline, a conductor film 14 of, for example, about 40 nm in thickness made of a refractory metal silicide and a cap insulating film 15 made of silicon oxide or the like are deposited in the order of mention by CVD.

Figure 37:
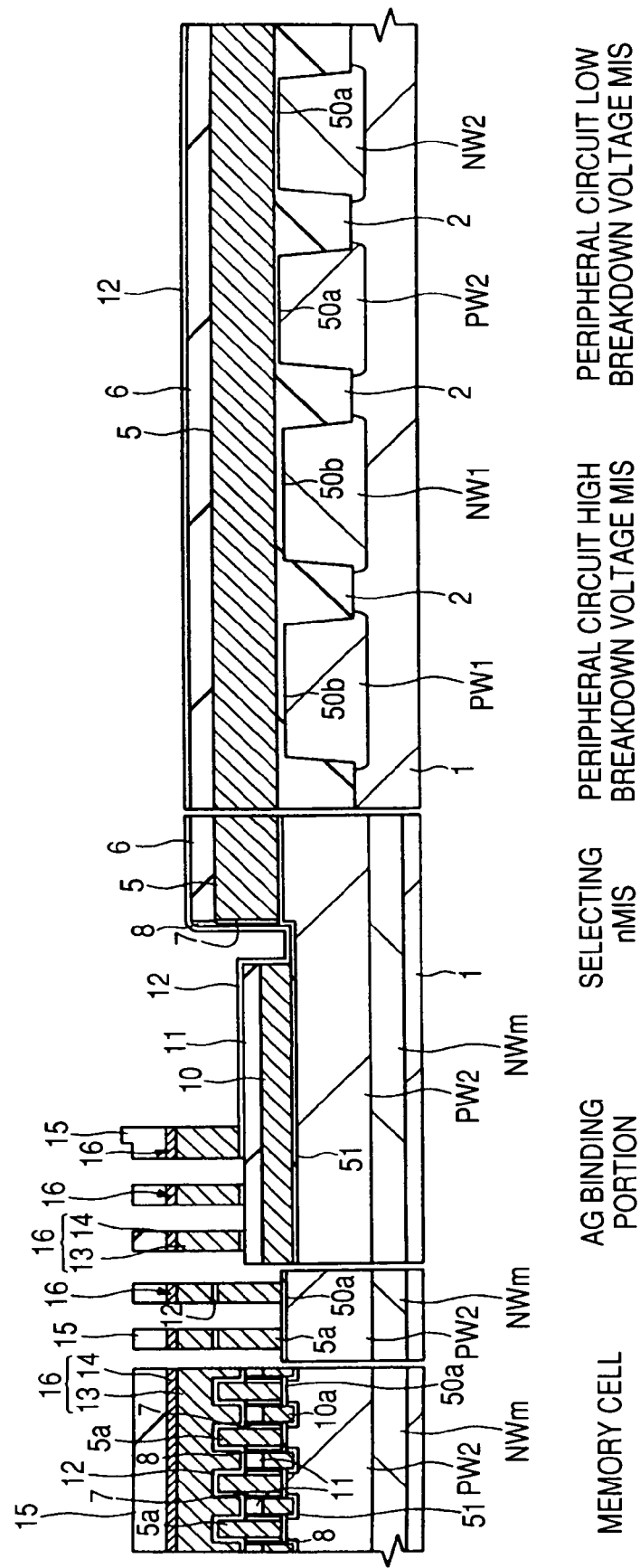
FIG. 37 is a fragmentary cross-sectional view of the same portion as that of FIG. 24 during a manufacturing step of the flash memory following that of FIG. 36.

As illustrated in FIG. 37, with a resist pattern formed by photolithography as a mask, the cap insulating film 15 and conductor films 13 and 14 exposed therefrom are removed by dry etching, whereby control gate electrodes 16 of the memory cell each made of the conductor films 13 and 14 are formed.

With a resist pattern formed by photolithography and the remaining cap insulating film 15 as masks, the interlayer film 12 and conductor film 5 exposed therefrom are removed by dry etching, whereby the floating gate electrodes 5a of the memory cell are patterned in the gate length direction. As a result, the control gate electrode 16 and floating gate electrodes 5a of the memory cell are completed.

Figure 38:
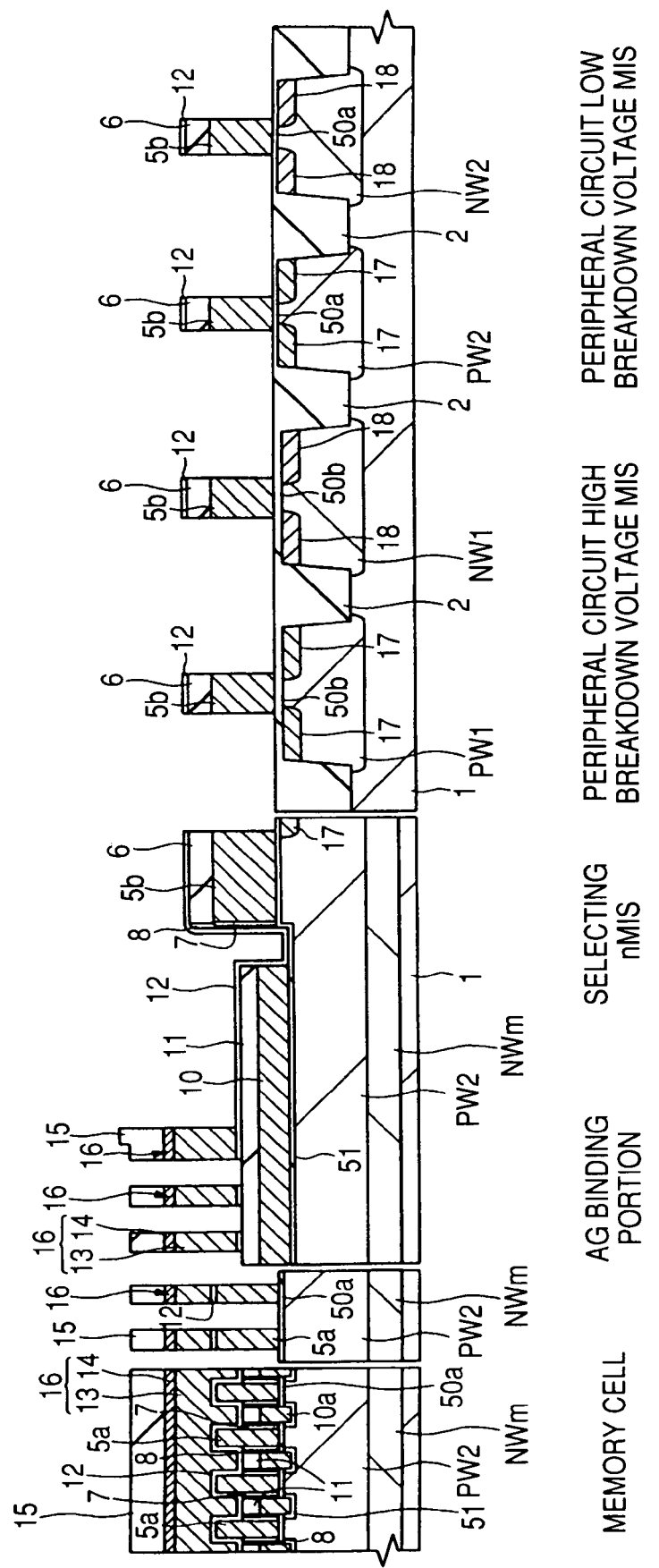
FIG. 38 is a fragmentary cross-sectional view of the same portion as that of FIG. 24 during a manufacturing step of the flash memory following that of FIG. 37.

As illustrated in FIG. 38, with a resist pattern formed by photolithography as a mask, the interlayer film 12, insulating film 6 and conductor film 5 of the peripheral circuit exposed from the mask are removed by dry etching, whereby the gate electrodes 5b of the selecting nMIS, peripheral circuit high breakdown voltage nMIS and pMIS and peripheral circuit low breakdown voltage nMIS and pMIS are formed.

Next, a pair of n type semiconductor regions 17 having a relatively low impurity concentration and constituting a portion of the source and drain of each of the selecting nMIS, and peripheral circuit high breakdown voltage and low breakdown voltage nMISs and a pair of p type semiconductor regions 18 having a relatively low impurity concentration and constituting a portion of the source and drain of each of the peripheral circuit high breakdown voltage and low breakdown voltage pMISs are formed.

Figure 39:
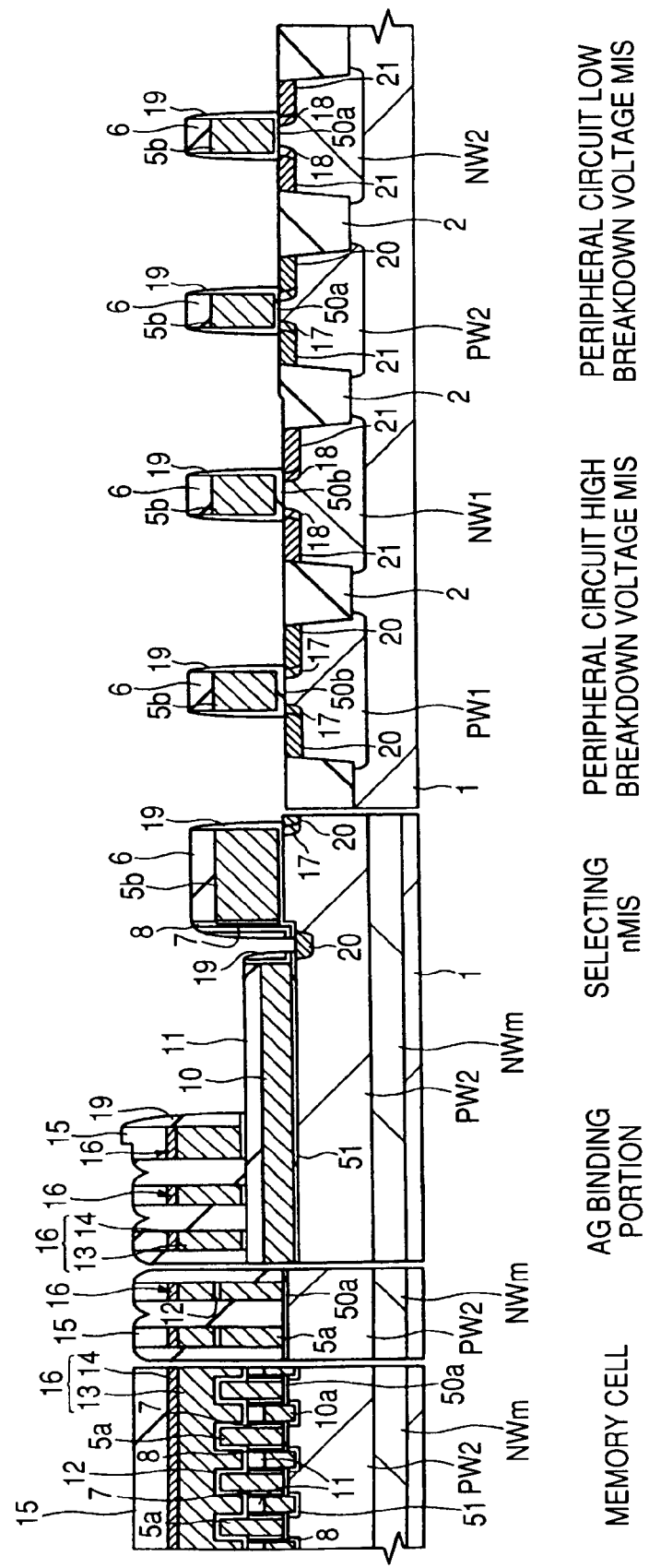
FIG. 39 is a fragmentary cross-sectional view of the same portion as that of FIG. 24 during a manufacturing step of the flash memory following that of FIG. 38.

As illustrated in FIG. 39, sidewalls 19 are formed over the side surfaces of the gate electrodes 5b of each of the selecting nMIS, peripheral circuit high breakdown voltage nMIS and pMIS and peripheral circuit low breakdown voltage nMIS and pMIS. Then, a pair of n type semiconductor regions 20 having a relatively high impurity concentration and constituting the other portion of the source and drain of each of the selecting nMIS, and peripheral circuit high breakdown voltage and low breakdown voltage nMISs and a pair of p type semiconductor regions 21 having a relatively high impurity concentration and constituting the other portion of the source and drain of each of the peripheral circuit high breakdown voltage and low breakdown voltage pMISs are formed. In order to activate the impurity ions thus implanted, the semiconductor substrate 1 is heat treated at a temperature, for example, from about 900° C. to 1000° C. By the above-described steps, various MISs of the memory array and peripheral circuit are formed.

A flash memory as illustrated in FIG. 18 is manufactured by the following steps performed as in the above-described Embodiment 1 so that the description on them is omitted.

According to Embodiment 2, advantages similar to those obtained in the above-described Embodiment 1 can be obtained. In addition, since the insulating film 50b functioning as a gate insulating film of the peripheral circuit high breakdown voltage nMIS and pMIS is formed over the main surface of the semiconductor substrate 1 which is clean and damage-free, a highly-reliable gate insulating film of the high breakdown voltage nMIS and pMIS can be obtained. This makes it possible to form the high breakdown voltage nMIS and pMIs with high reliability in the peripheral circuit.

The inventions made by the present inventors were described specifically based on some embodiments. It is however needless to say that the present invention is not limited to them but can be changed within a range not departing from the scope of the present invention.

The inventions made by the present inventors were applied to a semiconductor device composed only of an AND flash memory which belongs to the industrial field becoming the background of the invention, but they are applied not only to it but also a semiconductor device having composed only of an EEPROM, and memory-embedded semiconductor device such as system LSI (Large Scale Integrated Circuit) having EEPROM or flash memory.

The semiconductor device of the present invention can be applied to semiconductor devices having a nonvolatile semiconductor memory such as EEPROM or flash memory.

What is claimed is:

1. A manufacturing method of a semiconductor device equipped with a plurality of nonvolatile memory cells each comprising a plurality of first electrodes placed over a semiconductor substrate, a plurality of second electrodes disposed over the semiconductor substrate to cross the plurality of first electrodes, and a plurality of third electrodes for charge accumulation disposed at positions which lie between any two adjacent ones of the plurality of first electrodes and overlap with the plurality of second electrodes two-dimensionally, the method comprising the steps of:

(a) forming a first insulating film over the semiconductor substrate;

(b) depositing, over the first insulating film, a third-electrode forming conductor film;

(c) depositing a second insulating film over the third-electrode forming conductor film;

(d) patterning the second insulating film and the third-electrode forming conductor film to form a plurality of layered patterns having the second insulating film and the third-electrode forming conductor film;

(e) forming sidewalls over the side surfaces of each of the plurality of layered patterns;

(f) forming a third insulating film over the semiconductor substrate between any two adjacent ones of the plurality of layered patterns;

(g) depositing over the semiconductor substrate a first-electrode forming conductor film to fill the film between any two adjacent ones of the plurality of layered patterns;

(h) removing the first-electrode forming conductor film to leave the film between any two adjacent ones of the plurality of layered patterns, thereby forming the plurality of first electrodes between any two adjacent ones of the plurality of layered patterns in self alignment with the plurality of layered patterns;

(i) depositing a fourth insulating film over the semiconductor substrate to fill the film between any two adjacent ones of the plurality of layered patterns;

(j) removing the fourth insulating film to leave a portion of the fourth insulating film between any two adjacent ones of the plurality of layered patterns, thereby forming the pattern of the fourth insulating film over the plurality of first electrodes between any two adjacent ones of the plurality of layered patterns in self alignment with the plurality of layered patterns;

(k) removing the second insulating film;

(l) removing the exposed sidewalls;

(m) depositing a fifth insulating film over the semiconductor substrate;

(n) depositing a second-electrode forming conductor film over the fifth insulating film;

(o) patterning the second-electrode forming conductor film to form the plurality of second electrodes; and (p) patterning the third-electrode forming conductor film with the plurality of second electrodes as a mask, thereby forming the plurality of third electrodes having a projecting cross-section permitting the plurality of third electrodes to be higher than the plurality of first electrodes in self alignment with the plurality of second electrodes.

2. A manufacturing method of a semiconductor device according to claim 1, further comprising a step of:

(q) after the step (e), etching the semiconductor substrate between any two adjacent ones of the plurality of layered patterns by from about 10 nm to 20 nm.

3. A manufacturing method of a semiconductor device according to claim 1, wherein the first insulating film has, as a main component, silicon oxide formed by thermal oxidation.

4. A manufacturing method of a semiconductor device according to claim 1, wherein the third-electrode forming conductor film has polycrystalline silicon as a main component.

5. A manufacturing method of a semiconductor device according to claim 1, wherein the second insulating film has silicon oxide as a main component and the fourth insulating film has silicon nitride as a main component.

6. A manufacturing method of a semiconductor device according to claim 1, wherein the plurality of third electrodes have a columnar shape.

7. A manufacturing method of a semiconductor device according to claim 1, wherein the plurality of first electrodes have a function of forming an inversion layer over the semiconductor substrate.

8. A manufacturing method of a semiconductor device according to claim 1, further comprising the steps for the formation of a field effect transistor over the semiconductor substrate:

(r) forming a gate insulating film of the field effect transistor from an insulating film which has been formed as the same layer with the third insulating film by the step (f);

(s) patterning, after the step (p), a portion of the first-electrode forming conductor film which has remained after the step (p) for the formation of the gate electrode of the field effect transistor, to form the gate electrode of the field effect transistor; and (t) after the step (s), introducing an impurity into the semiconductor substrate to form a source and a drain of the field effect transistor.

9. A manufacturing method of a semiconductor device according to claim 1, further comprising the steps for the formation of first and second field effect transistors over the semiconductor substrate:

(r) in the step (f), forming a gate insulating film of the first and second field effect transistors;

(s) patterning, after the step (p), a portion of the first-electrode forming conductor film which has remained after the step (p) for the formation of the gate electrode of the first and second field effect transistors, to form the gate electrodes of the first and second field effect transistors; and (t) after the step (s), introducing an impurity into the semiconductor substrate to form a source and a drain of each of the first and second field effect transistors, said step (r) further comprising the steps of:

(r1) subjecting the semiconductor substrate to thermal oxidation treatment to form a sixth insulating film over the semiconductor substrate;

(r2) removing the sixth insulating film existing between any two adjacent ones of the plurality of layered patterns and in the first field effect transistor formation region; and (r3) subjecting the semiconductor substrate to thermal oxidation treatment to form the third insulating film over the semiconductor substrate between any two adjacent ones of the plurality of layered patterns, forming a gate insulating film of the first field effect transistor made of an insulating film formed as the same layer as the third insulating film over the semiconductor substrate in the first field effect transistor formation region, and forming a gate insulating film of the second field effect transistor thicker than the third insulating film over the semiconductor substrate in the second field effect transistor formation region.

10. A manufacturing method of a semiconductor device according to claim 9, wherein the thermal oxidation treatment applied to the semiconductor substrate in the steps (r1) and (r3) is ISSG oxidation.

11. A manufacturing method of a semiconductor device according to claim 1, further comprising the steps for the formation of a field effect transistor over the semiconductor substrate:

(r) forming a gate insulating film of the field effect transistor from an insulating film formed as the same layer as the first insulating film by the step (a);

(s) patterning, after the step (p), a portion of the third-electrode forming conductor film which has remained after the step (p) for the formation of the gate electrode of the field effect transistor, to form the gate electrode of the field effect transistor; and (t) after the step (s), introducing an impurity into the semiconductor substrate to form source and a drain of the field effect transistor.

12. A manufacturing method of a semiconductor device according to claim 1, further comprising the steps for the formation of first and second field effect transistors over the semiconductor substrate:

(r) in the step (a), forming a gate insulating film of the first and second field effect transistors;

(s) patterning, after the step (p), a portion of the third-electrode forming conductor film which has remained after the step (p) for the formation of the gate electrode of the first and second field effect transistors, to form the gate electrodes of the first and second field effect transistors; and (t) after the step (s), introducing an impurity into the semiconductor substrate to form source and drain of each of the first and second field effect transistors, said step (r) further comprising the steps of:

(r1) subjecting the semiconductor substrate to thermal oxidation treatment to form a sixth insulating film over the semiconductor substrate;

(r2) removing the sixth insulating film from the plurality of nonvolatile memory cell formation regions and the first field effect transistor formation region; and (r3) subjecting the semiconductor substrate to thermal oxidation treatment to form the first insulating film over the semiconductor substrate in the plurality of nonvolatile memory cell formation regions, forming a gate insulating film of the first field effect transistor made of an insulating film formed as the same layer as the first insulating film over the semiconductor substrate in the first field effect transistor formation region, and forming a gate insulating film of the second field effect transistor thicker than the first insulating film over the semiconductor substrate in the second field effect transistor formation region.

13. A manufacturing method of a semiconductor device according to claim 12, wherein the thermal oxidation treatment applied to the semiconductor substrate in the steps (r1) and (r3) is ISSG oxidation.

* * * * *